United States Patent [19]
Arimoto

[11] Patent Number: 5,519,657
[45] Date of Patent: May 21, 1996

[54] SEMICONDUCTOR MEMORY DEVICE HAVING A REDUNDANT MEMORY ARRAY AND A TESTING METHOD THEREOF

[75] Inventor: Kazutami Arimoto, Hyogo, Japan

[73] Assignee: Mitsubishi Denki Kabushiki Kaisha, Tokyo, Japan

[21] Appl. No.: 312,741

[22] Filed: Sep. 27, 1994

[30] Foreign Application Priority Data

Sep. 30, 1993 [JP] Japan .................. 5-244410

[51] Int. Cl.$^6$ .................................. G11C 7/00
[52] U.S. Cl. .............. 365/200; 365/201; 365/225.7
[58] Field of Search ............................ 365/200, 201, 365/225.7, 230.06; 371/10.2

[56] References Cited

U.S. PATENT DOCUMENTS

| | | | |
|---|---|---|---|
| 4,376,300 | 3/1983 | Tsang | 365/200 |
| 5,083,294 | 1/1992 | Okajima | 365/200 |
| 5,293,348 | 3/1994 | Abe | 365/200 X |
| 5,307,316 | 4/1994 | Takemae | 365/200 |

OTHER PUBLICATIONS

"DRAM Technologies for File Applications", Goro Kitsukawa et al., 1993 IEEE ISSCC, Digest of Technical Papers, Feb. 24, 1993, pp. 48–49.

Primary Examiner—Joseph A. Popek
Attorney, Agent, or Firm—Lowe, Price, LeBlanc & Becker

[57] ABSTRACT

A memory device includes a plurality of memory arrays each having a plurality of memory cells arranged in rows and columns, and at least one spare arrays having the same arrangement of memory cells as the memory array. A word line connecting a row of memory cells at a first address in a memory array is replaced by a spare word line connecting a row of memory cells at the first address in the spare memory array. Such a replacement scheme provides a word line by word line replacement and an array by array replacement with a simplified replacement control circuit and reduced area penalty.

45 Claims, 27 Drawing Sheets n=1~16,
m=1~4

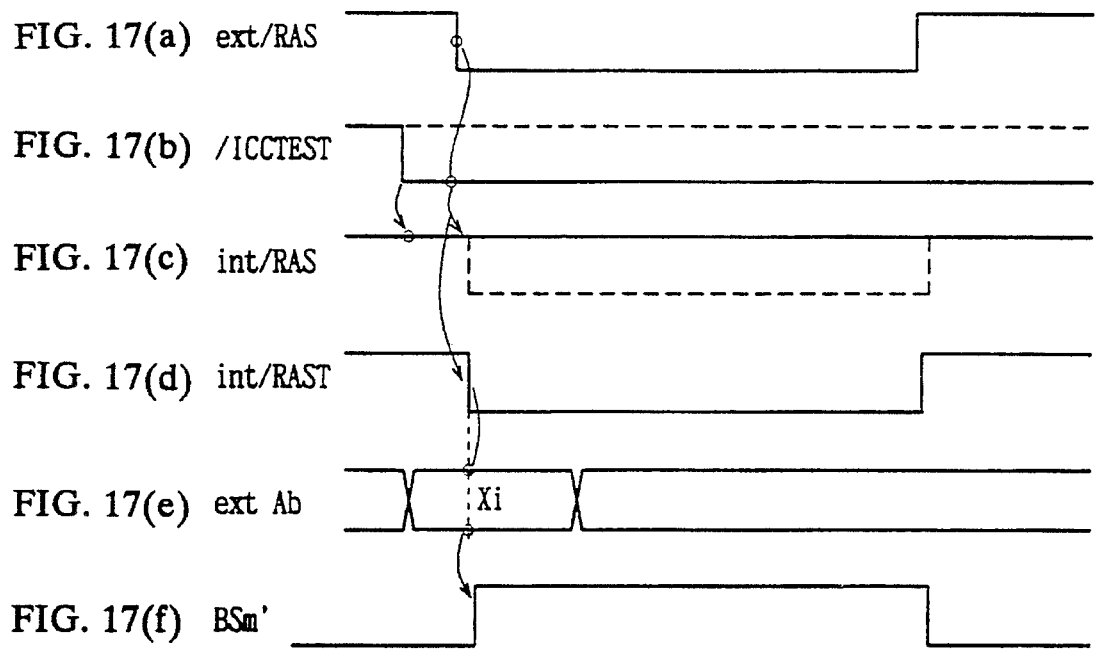
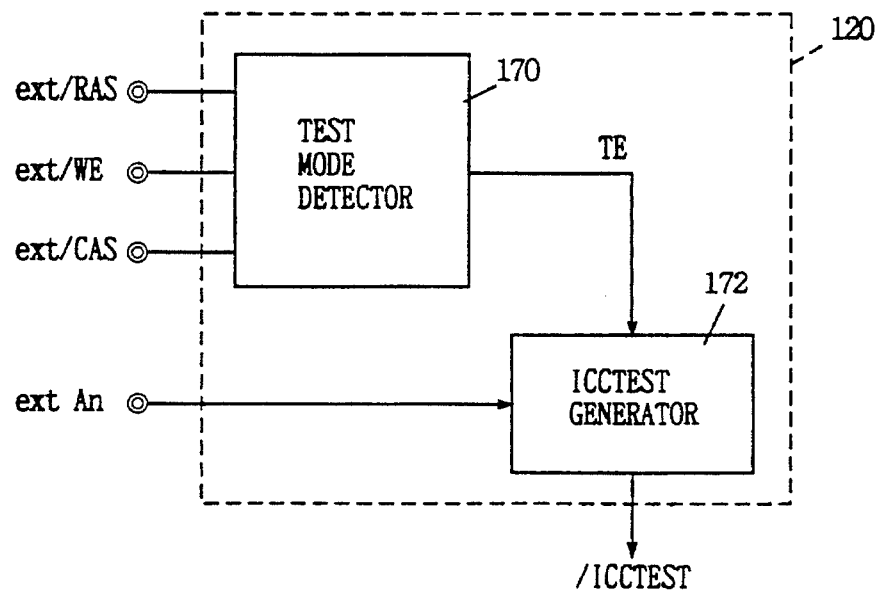
FIG. 18

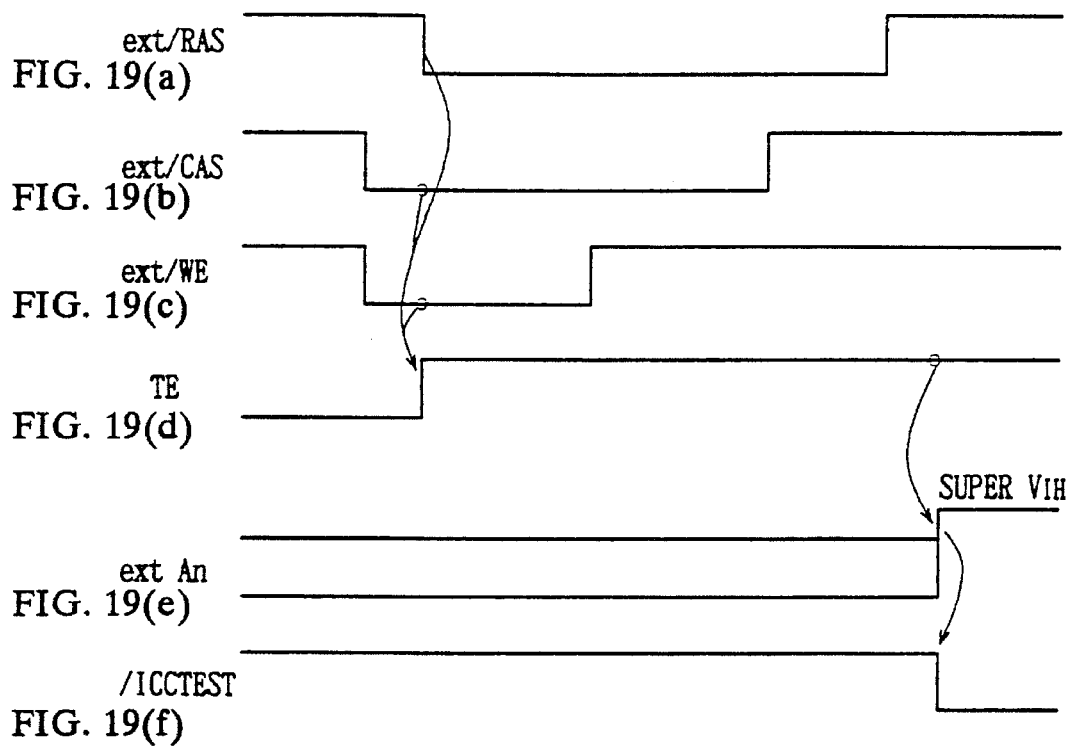
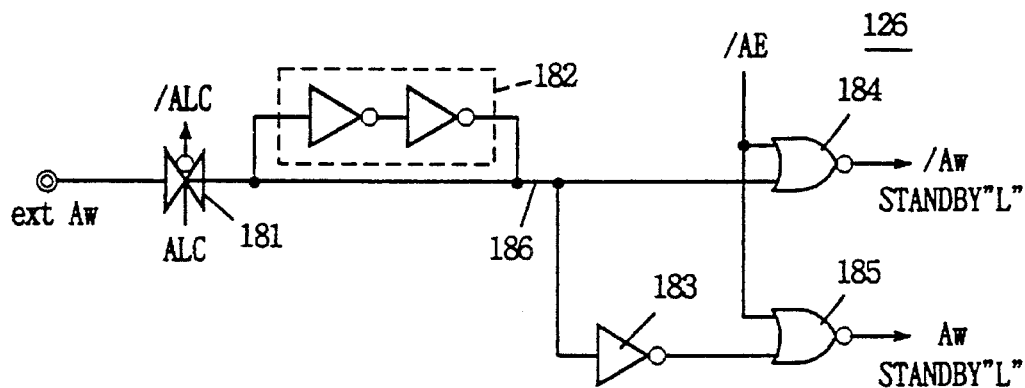
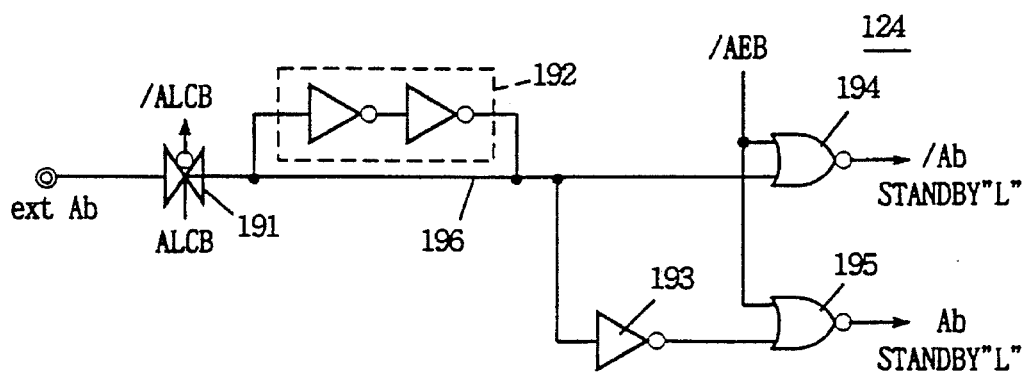

FIG. 21A
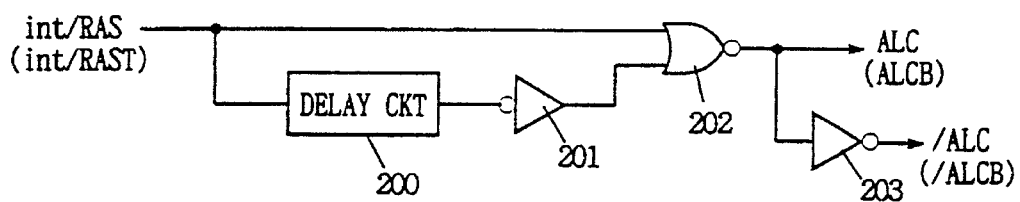
FIG. 21B(a)
FIG. 21B(b)
FIG. 21B(c)
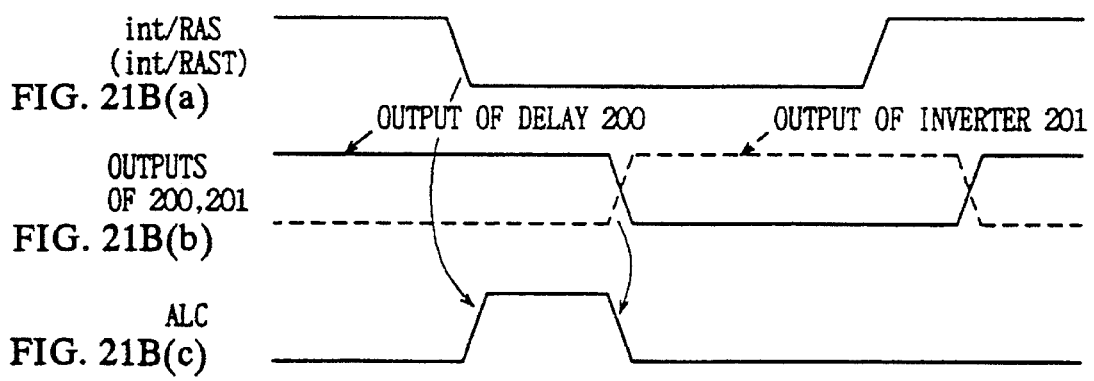
FIG. 22A
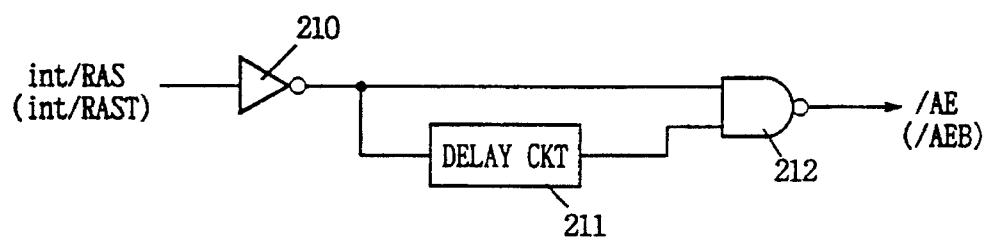
FIG. 22B(a)
FIG. 22B(b)
FIG. 22B(c)
FIG. 22B(d)
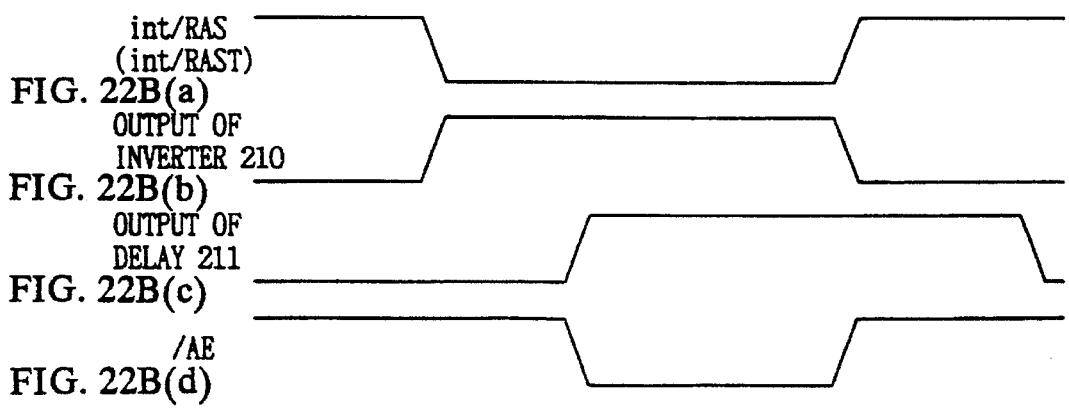

SEMICONDUCTOR MEMORY DEVICE HAVING A REDUNDANT MEMORY ARRAY AND A TESTING METHOD THEREOF

BACKGROUND OF THE INVENTION

1. Field of the Invention

The present invention relates to a semiconductor memory device having a spare memory array for repairing a defective memory cell and to a method of testing the memory device.

2. Description of the Related Art

FIG. 33 schematically shows an arrangement of a main portion of a conventional semiconductor memory device such as a dynamic type random access memory.

Referring to FIG. 33, the memory device includes four memory arrays MA1–MA4 each having a plurality of memory cells arranged in rows and columns, row decoders RD1–RD4 provided corresponding to the respective memory arrays MA1–MA4, spare memory arrays SMA1–SMA4 provided corresponding to the respective memory arrays MA1–MA4, spare row decoders SR1–SRD4 provided corresponding to the respective spare memory arrays SMA1–SMA4, and a column decoder CD provided in common to the memory arrays MA1–MA4 and to the spare memory arrays SMA1–SMA4.

Each of memory arrays MA1–MA4 includes 16 word lines WL(m, 1)–WL(m, 16) each connecting a row of memory cells, where m is one of integers 1–4.

Row decoder RDm selects a word line WL(m, n) in a corresponding memory array MAm in accordance with a row address signal and an array address signal with n=1–16. The row address signal designates a row or a word line in each of memory arrays MA1–MA4, and the array address signal designates a memory array.

Each of spare memory arrays SMA1–SMA4 includes four word lines SWL(m, 1)–SWL(m, 4) and can repair at most four defective word lines in corresponding memory arrays MA1–MA4.

Each of spare row decoders SRD1–SRD4 has a failure address designating a defective word line in a corresponding memory array programmed therein, and when a defective word line is addressed, a spare row decoder having a corresponding failure address programmed therein selects a corresponding spare word line in the corresponding spare memory array.

The column decoder CD selects a column in each of memory arrays MA1–MA4 and spare memory arrays SMA1–SMA4 in accordance with a column address signal.

In the arrangement of FIG. 33, repairing of a defective word line is effected in the following manner. If a word line WL(1, 3) in memory array MA1 is found defective, the word line WL(1, 3) is replaced by a spare word line SWL(1, 1) in spare memory array SMA1. The spare memory array SMA1 can repair a defective word line WL(1, n) (n=1–16) only in memory array MA1, and cannot repair a defective word line in any other memory arrays MA2–MA4.

In FIG. 33, it is shown, as an example, that a word line WL(1, 3) is replaced by a spare word line SWL(1, 1), a word line WL (1, 6) is replaced by a spare word line SWL(1, 2), a word line WL(1, 12) is replaced by a spare word line SWL(1, 3) and a word line WL(1, 16) is replaced by a spare word line SWL(1, 4).

FIG. 34 shows a schematic arrangement for replacement control circuitry used in the memory device shown in FIG. 33. Referring to FIG. 34, four program circuits PR1–PR4 are provided for storing defective word line address signals and for determining whether a defective word line is addressed. Each of program circuits PR1–PR4 stores defective word line addresses repaired by the spare word lines at the same locations in the respective spare memory arrays SMA1–SMA4. That is, program circuit PR1 stores the addresses of defective word lines replaced by the spare word line SWL(1, 1), SWL(2, 1), SWL(3, 1) and SWL(4, 1). Thus, program circuit PR1 includes four link circuits LINK1–LINK4 for storing the defective word line addresses repaired by the spare word lines SWL(1, 1), SWL(2, 1), SWL(3, 1) and SWL(4, 1), respectively. Program circuit PR4 similarly includes four link circuits LINK1–LINK4 for storing defective word line addresses repaired by the spare word lines SWL(1, 4), SWL(2, 4), SWL(3, 4) and SWL(4, 4), respectively.

Decision circuits D1–D4 are provided corresponding to the program circuits PR1–PR4. Decision circuits D1–D4 each decide whether a corresponding group of spare word lines is designated in response to the outputs of program circuits PR1–PR4 and generate a control signal SEEx(x=1–4) based on the result of determination.

Spare row decoders SRD(1, 1), SRD(2, 1), SRD(3, 1) and SRD(4, 1) receive the control signal SEE1 from the decision circuit D1. In general, spare row decoder SRD(m, x) receives an array designating signal BSm and a control signal SEEx, where x=1–4, m=1–4.

Each of row decoders RD(m, n) is provided with a gate Gmn for enabling and disabling a corresponding row decoder RD(m, n) in accordance with the array designating signal BSm and the control signal SEEx. In FIG. 34, only the gates G11, G21, G31 and G41 provided for row decoders RD(1, 1), RD(2, 1), RD(3, 1) and RD(4, 1) are representatively shown. Thus, row decoders RD(m, 1)–RD(m, 16) are grouped according to the control signals SEE1–SEE4.

A gate Gmn supplies an array request signal BSDmn in response to the signals BSm and SEEx to a row decoder RD(m, n).

FIG. 35 specifically shows the configuration of circuitry of FIG. 34. In FIG. 35, a spare row decoder SRD(m, x), a row decoder RD(m, n), a program circuit PRx, and related circuitry are representatively shown.

Program circuit PRx includes link circuits LINK1–LINK4 of the same configuration. The link circuit LINK1 includes a p channel MOS transistor QP11 responsive to a precharge signal PR for precharging a node N1 to a high voltage VPP, fuse elements F1.1–F1.8 connected to the node N1 in parallel with each other, and n channel MOS transistors QN1.1–QN1.8 connected respectively between the fuse elements F1.1–F1.8 and a ground potential node. MOS transistors QN1.1–QN1.8 receive internal (predecoded) address signals Xi(i=1–4) and Xj(j=5–8) at their gates. Upon programming a defective word line address, link elements F1.1–F1.8 are selectively cut off or blown off. More specifically, fuse elements among fuse elements F1.1–F1.8 corresponding to a defective word line address are cut off.

Decision circuit Dx includes a NOR gate NO31 receiving outputs of link circuit LINK1–LINK4, and an inverter INV31 for inverting an output of NOR gate NO31 to generate control signal SEEx.

A spare row decoder SRD(m, x) provided for a spare word line SWL(m, x) includes a NAND gate NA31 receiving the control signal SEEx and an array designating signal BSm to generate a spare word line designating signal SWEm.x, and an inverter INVSm.x for inverting the output SWEm.x of NAND gate NA31 to generate a spare word line drive signal at a high voltage VPP level onto the spare word line SWL(m, x). Here, the circuitry shown in FIG. 35 operates on the high voltage VPP, or employs the high voltage VPP as an operating power supply voltage.

A gate Gmn provided for the row decoder RD(m, n) includes an inverter INV32 for inverting the array designating signal BSm, a NOR gate NO32 receiving an output of inverter 32 and the control signal SEEx to generate a decoder enabling signal BSDmn.

A row decoder RD(m, n) includes a three-input NAND gate NAm.n receiving the signal BSDmn and internal (predecoded) address signal Xi and Xj, and an inverter INVm.n for inverting an output of NAND gate NAm.n to generate a word line drive signal at a high voltage level onto a word line WL(m, n). Now, operation of the circuitry of FIG. 35 will be briefly described.

In a precharge (standby) state, the precharge signal PR is at a low level to turn on MOS transistor QP1.1 in link circuit LINK1. Node N1 is precharged to a high level of the high voltage VPP. Link elements F1.1–F1.8 are previously programmed.

In an active state, the precharge signal PR goes high to turn off MOS transistor QP1.1. When a defective word line is addressed, as corresponding fuse elements are cut off, the node N1 maintains the high level at high voltage VPP. When a word line address not programmed in the link circuit LINK1 is supplied, at least one of MOS transistors QN1.1–QN1.8 turns on to discharge the node N1 to a ground potential.

Thus, the decision circuit Dx generates a high level control signal SEEx when an addressed word line should be replaced by one of spare word lines SWL(m, x) (m=1–4). Otherwise, the control signal SEEx maintains a low level.

When the control signal SEEx and the array designating signal BSm both go high, the spare row decoder SRD(m, x) supplies a high level spare word line drive signal at VPP level onto the spare word line SWL(m, x). Otherwise, the spare row decoder SRD(m, x) supplies a low level signal.

When the control signal SEEx is at a high level, NOR gate NO32 in the gate Gmn supplies a low level signal BSDmn to disable the row decoder RD(m, n).

When the control signal SEEx is at a low level, NOR gate NO32 is enabled, and the gate Gmn passes the array designating signal BSm therethrough. If the signals BSm, Xi and Xj designate the word line WL(m, n), row decoder RD(m, n) supplies a high level word line drive signal onto the word line WL(m, n).

FIG. 36 shows the arrangement for the row decoders and the spare row decoders for the memory array MA1. Referring to FIG. 36, row decoder RD1 includes row decoders RD(1, 1), R(1, 2) each including a NAND gate NA(1, n) and an inverter INV1.n. NAND gates NA(1, 1), NA(1, 2) receive different combinations of the signals Xi and Xj. The decoder enable signals BSD1n (n=1–16) are divided into groups according to the control signals SEEx.

For spare decoder SRD1, only inverters INVS1.1 and INVS1.4 are representatively shown.

FIG. 37 shows an arrangement related to a column in a memory cell array. Referring to FIG. 37, a column includes a pair of bit lines BL and /BL connecting a column of memory cells MC. In FIG. 37, a memory cell MC provided corresponding to a crossing of the bit line BL and a word line WL(m, n) is representatively shown. Memory cell MC includes a capacitor CS for storing data in a form of electric charges, and a transfer gate QN31 responsive to a potential on word line WL(m, n) for coupling the capacitor CS and the bit line BL. The capacitor CS receives a cell plate voltage VCP at an intermediate potential (=Vcc/2).

A pair of bit lines BL and /BL is provided with a sense amplifier SA for differentially amplifying the potentials on bit lines BL and /BL, and a precharge/equalize circuit BLEQ responsive to a precharge/equalize signal EQ for precharging and equalizing the bit lines BL and /BL to an intermediate voltage VBL(=Vcc/2).

The sense amplifier SA includes cross-coupled MOS transistors of a flipflop type.

Precharge/equalize circuit BLEQ includes an n channel MOS transistor QN32 for electrically connecting the bit lines BL and /BL, an n channel MOS transistor QN33 for transferring the intermediate voltage to the bit line BL, and an n channel MOS transistor QN34 for transferring the intermediate voltage VBL to the bit line /BL. MOS transistors QN32–QN34 turn on when the signal EQ goes high to indicate a standby state.

In operation, the signal EQ is at a low level, and MOS transistors QN32–QN34 are turned off. The bit lines BL and /BL are brought into an electrically floating state at the intermediate voltage VBL. When the word line WL(m, n) is selected, the potential thereof goes high to turn on the transfer gate QN31. Thus, the potential of bit line BL changes according to the data stored in the capacitor CS. The bit line /BL maintains the intermediate voltage VBL level. Then, the sense amplifier SA is activated to differentially amplifying the potentials on the bit lines BL and /BL.

According to an output of a column decoder (CD), the pair of bit lines BL and /BL is selected, and data writing or reading is performed to the memory cell MC.

After completion of memory cycle, the word line WL (m, n) potential goes low, and the transfer gate QN31 turns off. The sense amplifier SA is deactivated, and the signal EQ goes high. MOS transistors QN32–QN34 turn on to precharge and equalize the bit lines BL and /BL to the intermediate voltage VBL.

Since the word line WL(m, n) is raised to the high voltage VPP higher than an operating power supply voltage VCC, voltage at VCC level can be written into the memory cell capacitor CS without a loss due to the threshold voltage of transfer gate QN31. In addition, the transfer gate QN31 can be turned on quickly.

Using the redundant scheme as described above, a word line WL(m, n) can be repaired even if the memory cell MC is defective, or the word line WL(m, n) is open-circuited.

However, if word line WL(m, n) and the bit line BL is short-circuited as shown in FIG. 38 at R1, a current flows to the word line WL(m, n) from the bit line BL in a standby state. The word line WL(m, n) potential is discharged to a ground potential through a word driver (an inverter in a corresponding row decoder). Thus, the intermediate voltage VBL lowers, and in addition the standby current Icc2 is increased.

If the word line WL(m, n) is short-circuited with the cell plate voltage VCP supply line as shown in FIG. 38 at R2, the consumed current is increased and the cell plate voltage VCP is also lowered.

If the intermediate voltage VBL supply line is short-circuited with the bit line BL or /BL as shown at R3a or R3b in FIG. 38, the potential at bit line BL or /BL is not fully and correctly amplified by sense amplifier SA, and current flows into or out of the bit line BL or /BL to increase the current consumption in memory operation.

In addition, if sense amplifier SA is short-circuited with a VCC supply line or a ground line, a leakage current is caused. This holds for a defective word driver.

Such short-circuiting failure cannot be repaired by the conventional word line replacement scheme, because the short-circuit failure exists in a memory array.

In order to repair such short-circuit failure, an array-by-array replacement as shown in FIG. 39 is proposed by Kitsukawa et al., in "DRAM Technologies for File Application", 1993 IEEE ISSCC, Digest of Technical Papers, Feb. 24, 1993, pp. 48 and 49.

Referring to FIG. 39, a memory device includes four memory arrays MA1–MA4 having memory cells arranged in rows and columns, and a spare memory array SMA having the same size as each of memory arrays MA1–MA4. Memory arrays MA1–MA4 are provided with row decoders RD1–RD4, respectively, and the spare memory array SMA is provided with a spare row decoder SRD. A column decoder CD is provided in common for the arrays MA1–MA4 and SMA.

Row decoders RD1–RD4 receive the high voltage VPP on the source line 1a through fuse elements F41–F44, respectively, and the spare row decoder SRD receives the high voltage VPP through a switching element SW3.

Memory arrays MA1–MA4 receive the voltage VBL (VCP) on the supply line 1b through fuse elements F31 through F34, and the spare memory array SMA receives the voltage VBL (VCP) through a switching element SW2.

If a failure which could not be repaired by replacement of a word line is found in the memory array MA1, the fuse elements F31 and F41 are blown off, and the switching elements SW2 and SW3 are made turned on. In addition, an array address is programmed such that the spare memory array SMA is accessed when the memory array MA1 is accessed.

Kitsukawa describes that a word line replacement scheme will not sufficiently increase the product yield as the memory capacity increases, and that such block redundancy for array replacement would not significantly increase the chip area penalty because the number of memory arrays (blocks) is increased and array block size is reduced as the memory capacity increases.

However, according to such block redundancy scheme, even when only a failure which can be repaired by a word line replacement is present, a memory array is replaced with the spare memory array. If defective word lines are dispersed over memory arrays due to small size particles which tends to disperse over memory arrays, such defective word lines are not repaired even if the number of defective word lines is smaller than that of word lines in the spare memory array.

In addition, such block redundancy scheme does not allow the standby current test on an array basis and requires a long time for detecting a defective array.

Thus, in order to increase the product yield, it would be required that the word line by word line replacement and the array by array replacement both can be supported in a semiconductor memory device.

However, if the conventional word line replacement scheme and the conventional block redundancy scheme both are supported in a semiconductor memory device, chip area penalty is increased, the number of fuse elements is increased, and replacement control circuitry become complicate and large in size.

SUMMARY OF THE INVENTION

The object of the present invention is to provide a semiconductor memory device supporting a redundancy word line scheme and a block redundancy scheme without chip area penalty and with simplified replacement control circuitry.

Another object of the present invention is to provide a semiconductor memory device in which a defective memory array is readily detected.

Further object of the present invention is to provide a method of testing a memory device for detecting and repairing a failure therein.

A semiconductor memory device according to the present invention includes a plurality of memory arrays each having memory cells arranged in rows and columns, and at least one spare memory array having the same number of memory cells arranged in rows and columns as each of the memory arrays.

The memory device according to a preferred embodiment further includes row decoders provided for the rows of the respective memory arrays for decoding an address signal for generating row selection signals onto corresponding rows, array decoder for generating an array designating signal for enabling row decoders provided for the designated memory array, program circuits provided for the respective rows of the spare memory array for storing array addresses designating the memory arrays using the corresponding rows of the spare memory array and generating enabling signals when the same array addresses as the programmed array addresses are supplied, and spare decoders provided for the respective rows of the spare memory array and enabled by the corresponding enabling signals to decode the address signal and generate selection signals onto corresponding rows of the spare memory array. The enabling signals are supplied to the row decoders provided at rows of the same address in each of the memory arrays to disable the corresponding row decoders.

The testing method of the present invention includes the steps of performing standby current test on a memory array basis, replacing a defective memory array with a spare memory array if a defective array is present, performing a function test of each memory array and spare array, and storing a defective row address in a redundant program circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 17(a)–17(f) are waveform diagram showing an operation of the RAS buffer shown in FIG. 16.

FIG. 18 shows a schematic arrangement of an ICC test detector shown in FIG. 14.

FIGS. 19(a)–19(f) are an operating waveform diagram showing an operation of the ICC test detector shown in FIG. 18.

FIGS. 20A and 20B show a configuration of a row address buffer for word line selection and a configuration of a row address buffer for array selection shown in FIG. 14, respectively.

FIG. 21A shows a configuration of a control circuit generating an address latch enable signal shown in FIGS. 20A and 20B.

FIGS. 21B (a)–21B(a) are an operating waveform diagram showing an operation of the circuit shown in FIG. 21A.

FIG. 22A shows a configuration of a control circuit generating an address enabling signal shown in FIGS. 20A and 20B.

FIGS. 22B(a)–22B(d) is an operating waveform diagram showing an operation of the circuit shown in FIG. 22A.

DESCRIPTION OF THE PREFERRED EMBODIMENTS

Figure 1:
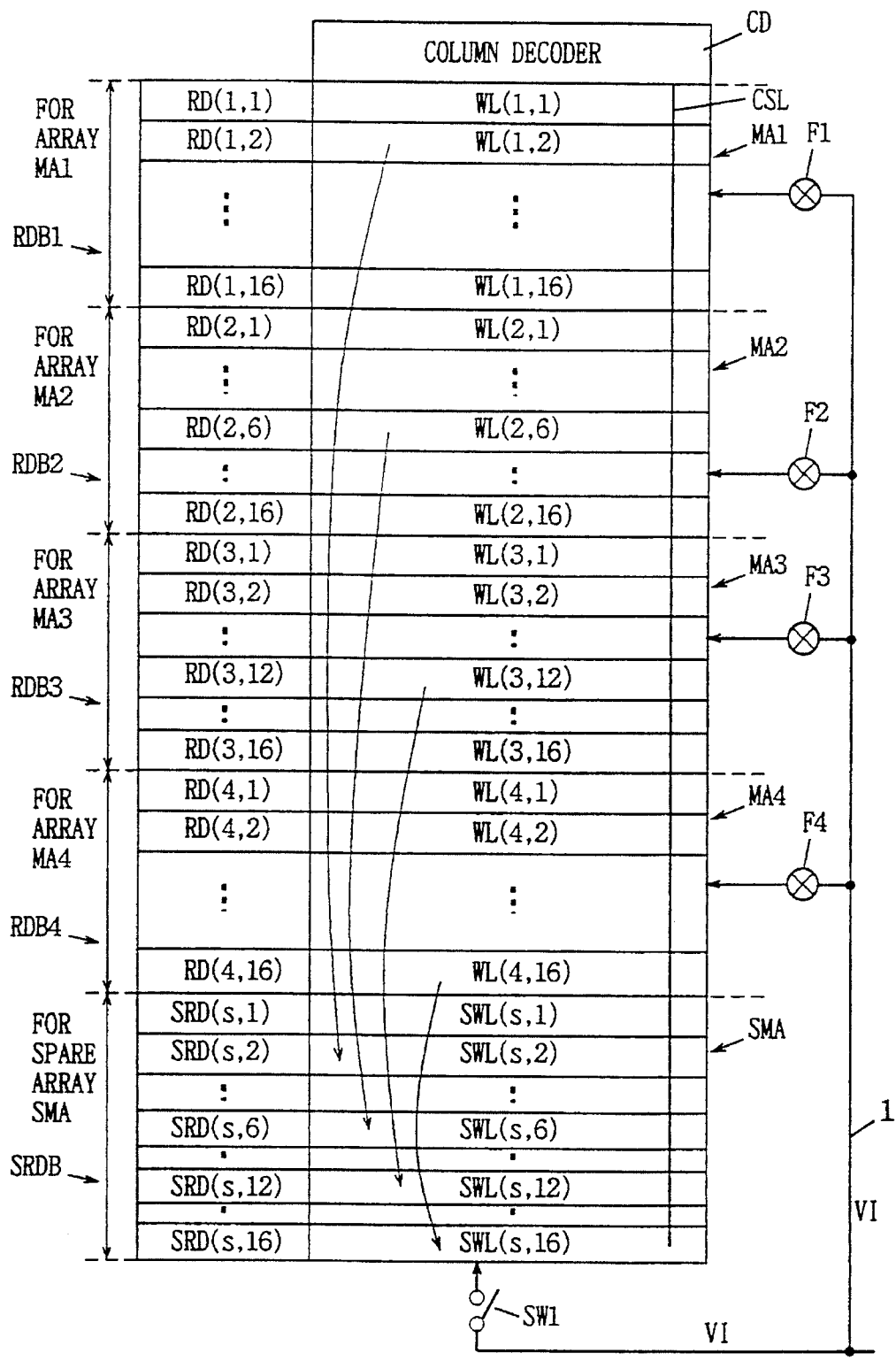
FIG. 1 shows an arrangement of a main portion of a semiconductor memory device of an embodiment according to the present invention.

FIG. 1 schematically shows an arrangement of a main portion of a semiconductor memory device such as a dynamic random access memory according to an embodiment of the present invention. Referring to FIG. 1, the memory device includes a plurality of memory arrays MA1–MAw (w=4 in FIG. 1 arrangement) each having memory cells arranged in rows and columns, and a spare memory array SMA having memory cells arranged in rows and columns for repairing a defective memory array through replacement therewith.

Each of memory arrays MA1–MAw includes X (16 in FIG. 1 arrangement) word lines WL(m, n) (m=1–w, n=1–X) each connecting one row of memory cells. In the discussion hereinafter, it is assumed that the memory device includes 4 memory arrays MA1–MA4 and each of memory arrays MA1–MA4 includes 16 word lines, for the sake of simplicity of discussion.

Spare memory array SMA includes the same number of spare word lines SWL(s, X) each connecting one row of memory cells as each of memory arrays MA1–MA4. Thus, spare memory array also includes 16 spare word lines.

Each of memory arrays MA1–MA4 is provided with a row decoder block RDBm (m is one of 1–4) including 16 row decoders RD(m, n) (n=1–16) provided corresponding to word lines WL(m, n) in the corresponding memory array MAm. Spare memory array SAM is also provided with 16 spare row decoders SRD(s, n) provided corresponding to the spare word lines SWL(s, 1)–SWL(s, 16).

A column decoder CD is provided in common to the respective memory arrays MA1–MA4 and spare memory array SMA. A column select line CSL for transferring a column select signal from column decoder CD extends over memory arrays MA1–MA4 and spare memory array SMA. Column select line CSL selects a column (a pair of bit lines) in each of memory arrays MA1–MA4 and spare memory array SMA, for example. Alternatively, the column select line CSL may select a plurality of columns in each of arrays MA1–MA4 and SMA.

An internal supply voltage VI such as a high voltage VPP for driving a word line, an intermediate voltage VBL for bit line precharge/equalization, and a cell plate voltage VCP is supplied through an interconnection line 1 via fuse elements F1–F4 to the respective memory array MA1–MA4 and the respective row decoder block RDB1–RDB4. Spare memory array SMA receives the internal supply voltage VI through a switching element SW1. Spare row decoder block SRDB also receives internal supply voltage such as high voltage VPP through switching element SW1.

High voltage VPP, bit line precharge/equalization intermediate voltage VBL and cell plate voltage VCP are transferred through different or separate fuse elements or switching elements to the arrays MA1–MA4 and SMA. However, FIG. 1 shows one fuse element provided for each memory array MAm and one switching element SW1 for spare memory array SMA, for the simplicity of illustration.

When spare memory array SMA is used, switching element SW1 is made conductive. If memory array MAm causes an excessive leak current and is defective, the corresponding fuse element Fm is cut off or blown off by an energy beam such as a laser beam. Now, repairing method will be described briefly.

Word line basis (word line by word line) repairing is performed in the following manner. When a k-th word line WL(m, k) in memory array MAm is defective and has to be repaired, the k-th word line WL(m, k) is replaced by a kth spare word line SWL(s, k) in spare memory array SMA. For example, a second word line WL(1, 2) in memory array MA1 is replaced by a second spare word line SWL(s, 2) in spare memory array SMA, a sixth word line WL(2, 6) in memory array MA2 is replaced by a sixth spare word line SWL(s, 6), a twelfth word line WL(3, 12) in memory array MA3 is replaced with a twelfth spare word line SWL(s, 12), and a sixteenth word line WL(4, 16) in memory array MA4 is replaced by a sixteenth spare word line SWL(s, 16), as shown in FIG. 1.

As far as different memory arrays have defective word lines of different numbers (row addresses), spare memory array SMA can replace all the defective word lines with spare word lines, so that such defective word lines can all be repaired.

If such replacement scheme is applied to a particular memory array MAm, this particular memory array MAm can be replaced as a whole with spare memory array SMA. Thus, this replacement arrangement enables both the word line by word line replacement and the array by array replacement. When the word line by word lines replacement is performed, switching element SW1 is rendered conductive and fuse elements F1–F4 are all conductive. If the memory array by memory array replacement is performed, switching element SW1 is made conductive and a fuse element Fu corresponding to a defective memory array MAu having an impermissible leak current caused is cut off or blown off to suppress current consumption therein.

Figure 2:
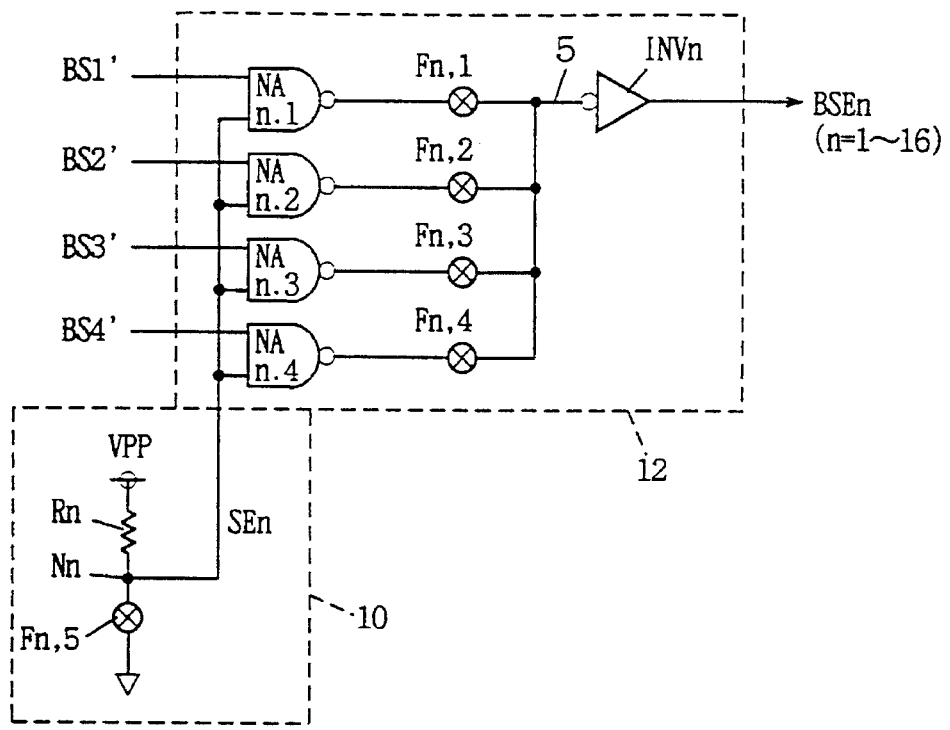
FIG. 2 shows a configuration of a program circuit for storing a defective word line address employed in the present invention.

FIG. 2 shows an arrangement for generating a spare row decoder enable signal BSEn. The arrangement of FIG. 2 is provided for each of spare row decoders SRD(s, 1)–SRD(s, 16). Referring to FIG. 2, the arrangement includes a first program circuit 10 for programming whether a corresponding spare word line SWL(s, n) is used, and a second program circuit 12 for programming which memory array uses the corresponding spare word line SWL(s, n).

The first program circuit 10 includes a resistance element Rn connected between a node receiving the high voltage VPP and a node Nn, and a fuse element Fn.5 connected between the node Nn and a ground potential node.

When the corresponding spare word line SWL(s, n) is used, that is, when a word line WL(m, n) in any one of memory arrays MA1–MA4 is defective, the fuse element Fn.5 is cut off or blown off by a laser beam, for example. The resistance element Rn pulls up the node Nn and the signal SEn then goes high to indicate that the corresponding spare word line SWL(s, n) is used.

When the corresponding spare word line SWL(s, n) is not used, the fuse element Fn.5 remains conductive. The resistance element Rn has a large resistance value, and the node Nn is discharged to the ground potential and the signal SEn goes low to indicate that the corresponding spare word line SWL(s, n) is not used.

The second program circuit 12 includes NAND gates NAn.1–NAn.4 provided corresponding to memory array designating signals BS1'–BS4' from a block decoder described later, fuse elements Fn.1–Fn.4 provided at respective outputs of NAND gates NAn.1–NAn.4, and an inverter INVn.

NAND gates NAn.1–NAn.4 each receive the signal SEn at one input. Outputs of NAND gates NAn.1–NAn.4 are supplied onto a signal line 5 through respective fuse elements Fn.1–Fn.4.

Inverter INVn inverts a signal on the signal line 5 to generate the spare row decoder enable signal BSEn controlling enabling/disabling of the spare row decoder SRD(s, n).

Upon programming of a memory array in the second program circuit 12, a fuse element at an output of NAND gate NAnm receiving a memory array designating signal BSm' indicating a memory array MAm which uses the corresponding spare word line SWL(s, n) is maintained conductive, and the other fuse elements are cut off.

For example, if the memory array MA1 uses the spare word line SWL(s, n), the fuse elements Fn.2–Fn.4 are cut off and the fuse element Fn.1 is maintained conductive. Only an output signal of NAND gate NAn.1 is transferred onto signal line 5. The signal SEn is made high when the corresponding spare word line SWL(s, n) is used.

When the memory array MA1 is addressed or is requested of accessing, the signal BS1' goes high, and an output signal of NAND gate NAn.1 goes low, and then the signal BSEn goes high.

When another memory array is addressed, the signal BS1' remains low, and the output signal of NAND gate NAn.1 remains high, and the signal BSEn remains low.

When none of memory arrays MA1–MA4 uses the corresponding spare word line SWL(s, n), all the fuse elements Fn.1–Fn.4 remain conductive. In this state, the signal SEn is at a low level as described previously, NAND gates NAn.1–NAn.4 are all disabled to generate high level signals irrespective of the logic levels of memory array designating signals BS1'–BS4'. Thus, a signal on the signal line 5 is at a high level and the signal BSEn remains low. The corresponding spare word line SWL (s, n) is kept in a non-selected state.

The arrangement of the programming circuits 10 and 12 shown in FIG. 2 allows formation of a row decoder RD(m, n) and a spare row decoder SRD(s, n) in the same configuration, and also simplified control for enabling/disabling of row decoder RD(m, n) and spare row decoder SRD(s, n), as described later in detail.

In addition, the number of fuse elements Fn.1–Fn.5 (n=1–16) is 80 in total excluding the fuse elements F1–F4 for the internal voltage and is very small as compared with the conventional word line repairing. The number may be 88 if such fuse elements F1–F4 are included because the fuse element Fm is provided for high voltage VPP and the intermediate voltage VBL.

In the memory device according to the present invention, a defective word line WL(m, n) in the memory array MAm is uniquely replaced by a spare word line SWL(s, n) of the same number (row address) in the spare memory array SMA, and there is no need for programming or storing which defective word line WL(m, n) is replaced by which spare word line SWL(s, n).

Meanwhile, the reason for the use of high voltage VPP for generating the signal SEn is as follows. Array designating signal BS1'–BS4' each are at a high voltage VPP level when activated as described later. Inverter INVn and NAND gates NAn.1–NAn.4 operate on the high voltage VPP. Thus, the high voltage VPP is used to conform the level of the signal SEn with the levels of the signals BS1'–BS4'. However, if the signals BS1'–BS4' each are at the operating power supply voltage VCC and NAND gates NAn.1–NAn.4 and inverter INVn operates on VCC, such operating power supply voltage VCC may be used in the first program circuit 10 in place of high voltage VPP.

Figure 3:
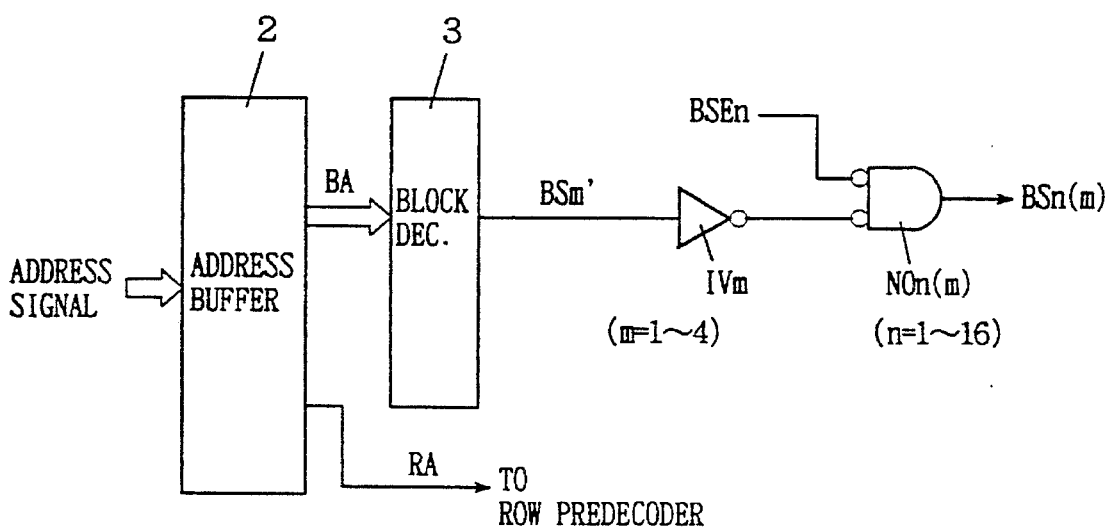
FIG. 3 shows a configuration of replacement control circuit for replacing a defective word line employed in the present invention.

FIG. 3 shows an arrangement for generating a normal decoder enable signal BSn(m) controlling enabling/disabling of a normal row decoder RD(m, n). Referring to FIG. 3, an address buffer 3 receives an external address signal and generates an array address signal BA addressing one of memory arrays MA1–MA4, and a row address signal RA addressing one of word lines WL(m,1)–WL(m, 16).

Block decoder 3 receives and decodes the array address signal BA to generate an array designating signal BSm'. Block decoder 3 operates on high voltage VPP as described previously. However, block decoder 3 may operate on operating power supply voltage VCC.

Figure 4:
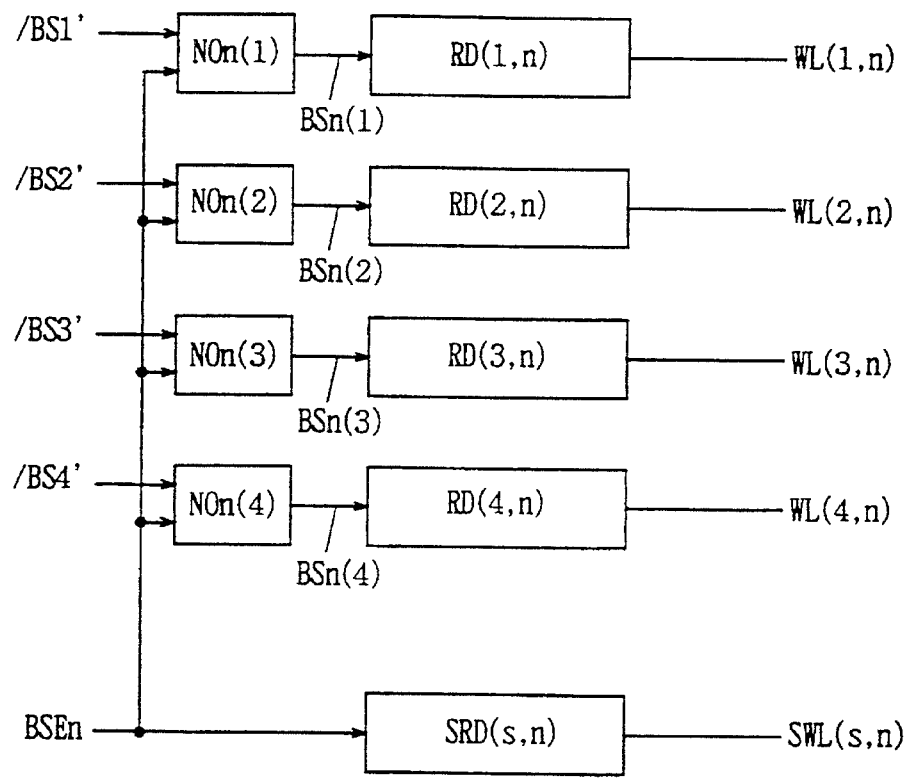
FIG. 4 shows a correspondence between a spare word line and word lines.

The arrangement of FIG. 3 further includes an inverter IVm for inverting the array designating signal $BS_m'$, and a NOR gate NOn(m) receiving an output of inverter IVm and the normal decoder enable signal BSEn to generate a normal decoder request signal BSn(m). NOR gate NOn(m) is provided corresponding to a row decoder RD(m, n) as shown in FIG. 4. In FIG. 4, NOR gates NOn(1)–NOn(4) provided corresponding to row decoders RD(1,n)–RD(4,n) are shown as an example NOR gates NOn(1)–NOn(4) receive inverted array designating signals/BS1'–/BS4', respectively, at their first inputs and the signal BSEn at their second inputs. Now, operation will be described with reference to FIGS. 3 and 4.

When the spare word line SWL(s, n) is not used, the signal BSEn is at a low level. The spare row decoder SRD(s, n) is disabled. NOR gate NOn(m) inverts the inverted array designating signal/BSm' to generate the signal BSn(m). One of row decoders RD(1, n)–RD(4, n) is enabled according to the normal decoder request signal BSn(m).

When the spare word line SWL(s, n) is used, the signal BSEn goes high only when a memory array using the spare word line SWL(s, n) is designated. It is assumed for the simplicity of description here that the memory array MA1 uses the spare word line SWL(s, n), that is, the word line WL(1, n) is defective and is replaced by the spare word line SWL(s, n).

When the array designating signal BS' goes high to designate the memory array MA1, the signal BSEn goes high to disable the NOR gate NOn(m), so that the signal BSn(m) (BSn(1)–BSn(4)) remains low and row decoders RD(1, n)–RD(4, n) are disabled. When a word line WL (1, a) other than the defective word line WL (1, n) is designated, a row decoder RD (1, a) is enabled by a corresponding decoder enable signal BSa(1) to select the word line WL(1, a) if the signal BSa(1) goes high.

When a memory array other than the memory array MA1 is designated, the signal BSEn is at a low level, and NOR gates NOn(m) (NOn(1)–NOn(4)) are enabled. One of the signals/BS2'–/BS4' goes low and accordingly an output BSn(m) of a corresponding NOR gate NOn(m) (m≈1) goes high to enable a corresponding row decoder RD(m, n).

Figure 5:
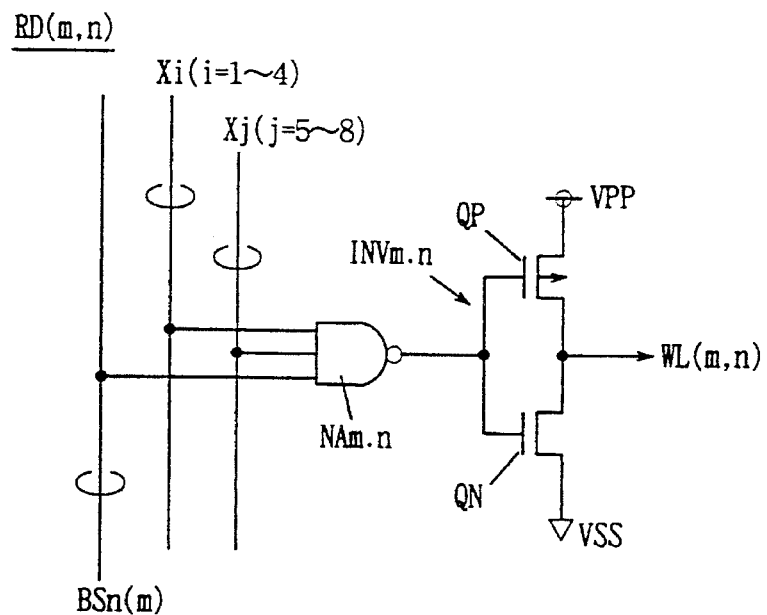
FIG. 5 shows a configuration of a row decoder.

FIG. 5 specifically shows a configuration of the row decoder RD(m, n) provided for the word line WL(m, n), where n is any of 1–16. Referring to FIG. 5, row decoder RD(m, n) includes three-input NAND gate NAm.n, and an inverter INVmn.

NAND gate NAm.n receives the decoder enable signal BSn(m) and one bit of predecode signals Xi(i=1–4) and one bit of predecode signals Xj(j=1–4), and supplies a low level signal when received signals BSn(m), Xi and Xj are all at high levels. Predecode signal Xi and Xj are predecoded by not shown predecoder.

Inverter INVm.n includes a p channel MOS transistor QP having a source connected to receive high voltage VPP, a gate receiving an output of NAND gate NAm.n and a drain connected to the word line WL(m, n), and an n channel MOS transistor QN having a source connected to receive a ground potential, a gate connected to receive the output of NAND gate NAm.n and a drain connected to the word line WL(m, n).

NAND gate NAm.n supplies a high level signal at high voltage VPP when not selected. NAND gate NAm.n may operate on high voltage VPP when the signals Xi, Xj and BSn(m) each are a signal of high voltage VPP. Alternatively, NAND gate NAm.n may have a level converter for converting a high level signal at the operating power supply voltage to a high voltage VPP level signal if the signals BSn(m), Xj and Xi are VCC level signal when selected or activated.

Figure 6:
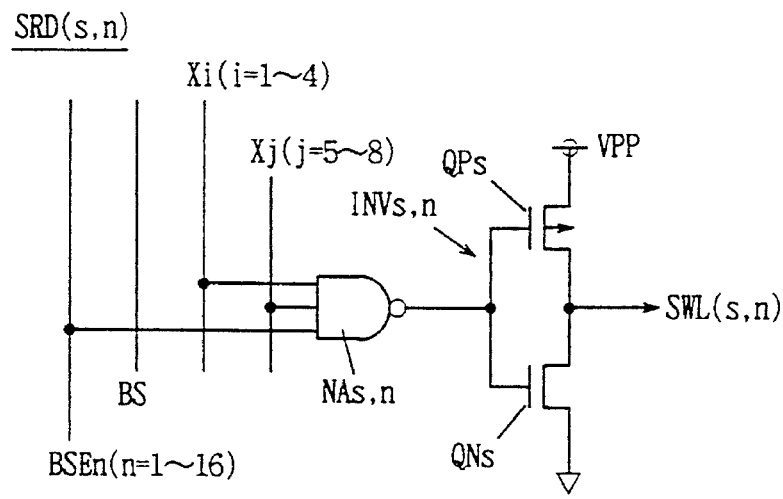
FIG. 6 shows a configuration of a spare row decoder.

FIG. 6 specifically shows a configuration of the spare row decoder SRD(s, n). Referring to FIG. 6, spare row decoder SRD(s, n) has the same configuration as row decoder RD(m, n), and includes an NAND gate NAs.n receiving the signal BSEn, one bit of the predecoded signal Xi, and one bit of the predecoded signal Xj, and an inverter INVs.n receiving an output of NAND gate NAs.n. Inverter INVs.n includes a p channel MOS transistor QPs and an n channel MOS transistor QNs. Inverter INVs.n operates on high voltage VPP. NAND gate NAs.n supplies a low level signal when received signal BSEn, Xi, Xj are all at a high level, so that the spare word line SWL(s, n) is selected.

As clearly seen from FIGS. 5 and 6, row decoder RD(m, n) and spare row decoder SRD(s, n) have the same configuration with each other. According to such configuration, no access delay is caused even when a spare word line is selected, and in addition the same layout pattern is repeated for the row decoders RD(m, n) and spare row decoders SRD(s, n), and area penalty is reduced.

Figure 7:
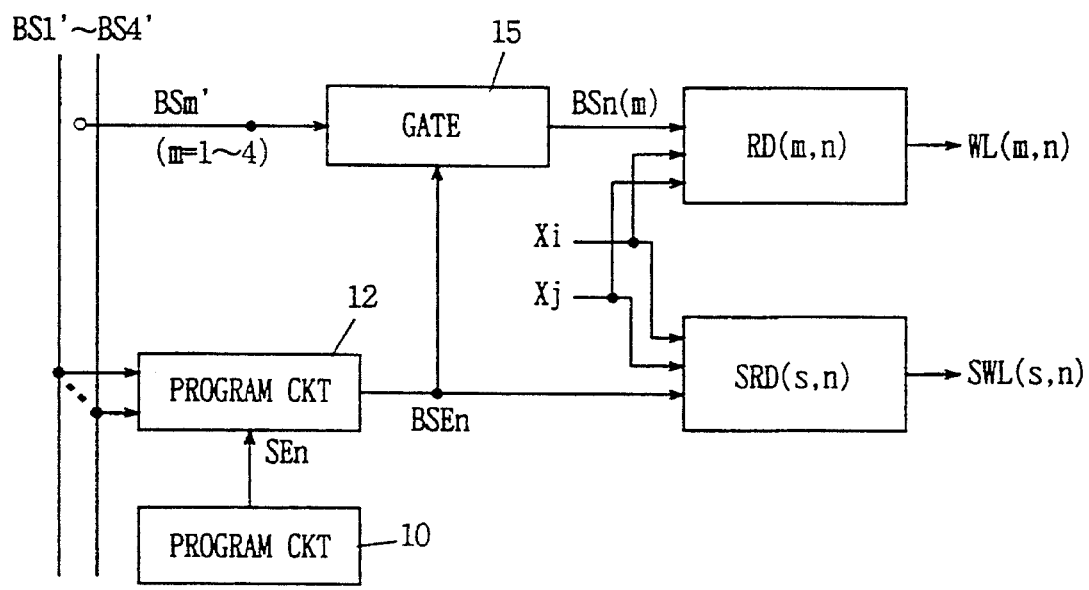
FIG. 7 shows an overall arrangement of word line selection circuitry related to a word line and a corresponding spare word line.

FIG. 7 illustrates a flow of signals related to selection of a word line. The memory array designating signals BS1'–BS4' are supplied to the second program circuit 12. The first program circuit 10 generates the signal SEn indicating that the corresponding spare word line SWL(s, n) is used. The program circuit 12 generates the decoder enable signal BSEn according to the signals BS1'–BS4' and BSEn. A gate 15 corresponding the inverter IVm and NOR gate NOn(m) of FIG. 3 receives a corresponding memory array designating signal BSm' and the decoder enable signal BSEn to generate the signal BSn(m) for application to the corresponding row decoder RD(m, n).

Predecoded signals Xi and Xj are commonly supplied to row decoder RD(m, n) and spare row decoder SRD(s, n). That is, decoders RD(m, n) and SRD(s, n) receive the predecoded signals Xi and Xj of the same combination with each other and are alternatively enabled by the signals BSn(m) and BSEn.

Figure 8:
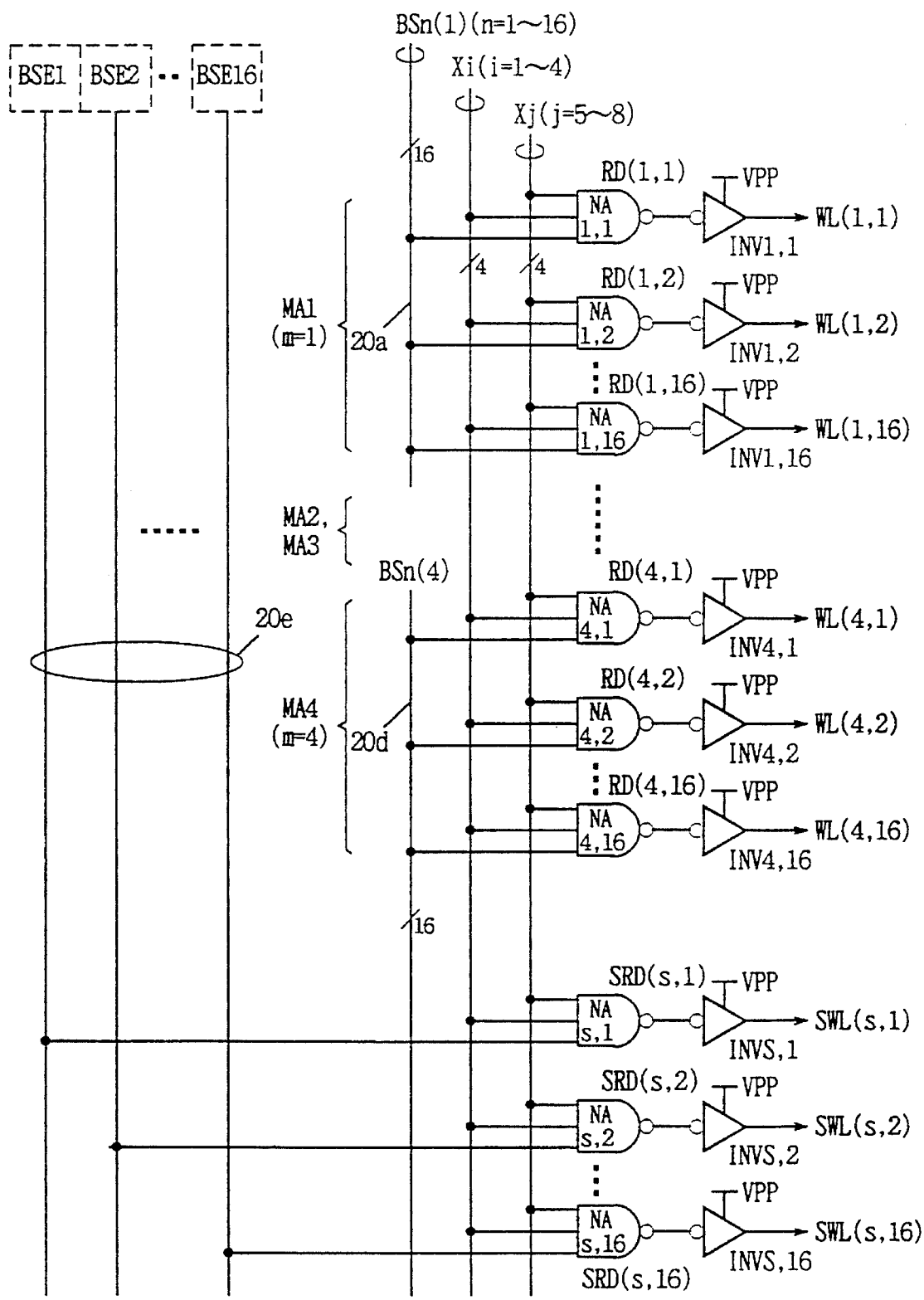
FIG. 8 shows an overall arrangement of row decoders and spare row decoders.

FIG. 8 shows an overall arrangement of row decoders and spare row decoders. In FIG. 8, row decoders RD(1, 1)–RD(1, 16) for the memory array MA1, row decoders RD(4, 1)–RD(4, 16) for the memory array MA4, and spare row decoders SRD(s, 1)–SRD(s, 16) for the spare memory array SMA are representatively shown. Three-input NAND gates NA(1, 1)–NA(1, 16) receive respectively at their first inputs the signal BS1(1)–BS16(1) (shown as BSn(1)) on 16 bit signal bus 20a. NAND gates NA(4, 1)–NA(4, 16) receive respectively at their first inputs the signals BS4(1)–BS4(16) (shown as BSn(4)) on 16 bit signal bus 20d. NAND gates NA(s, 1)–NA(s,16) receive the signals BSE1–BSE16 respectively at their first inputs on 16 bit signal bus 20e.

Spare word line SWL(s, n) can be replaced with only one of word lines WL(1, n)–WL(4, n), or WL(m, n).

Figure 9:
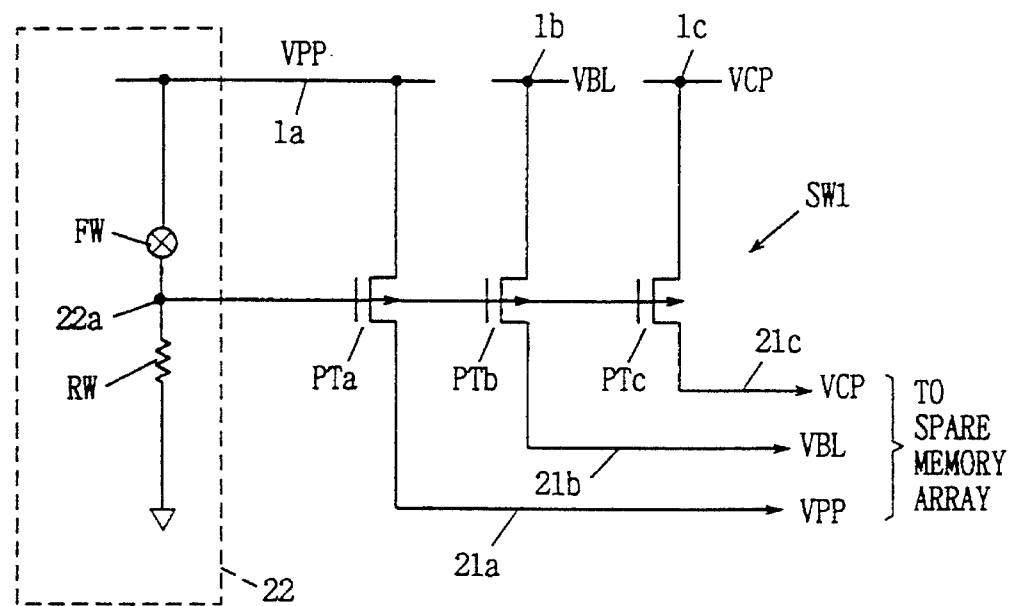
FIG. 9 shows a configuration of a switching element shown in FIG. 1.

FIG. 9 shows an arrangement for programming the switching element SW1. Switching element SW1 is comprised of a p channel MOS transistor PTa connected between a high voltage supply line 1a and a local high voltage line 21a, a p channel MOS transistor PTb connected between an intermediate voltage VBL supply line 1b and a local source line 21b, and a p channel MOS transistor PTc connected between another intermediate voltage VCP supply line 1c and a local source line 21c. The local lines 21a, 21b and 21c transmit the high voltage VPP, the intermediate voltage (bit line precharge/equalize voltage) VBL and the other intermediate voltage (cell plate voltage) VCP to the spare memory array SMA.

A program circuit 22 for programming the switching element SW1 includes a fuse element Fw connected between the high voltage supply line 1a and a node 22a, and a resistance element Rw of a high resistance value connected between the node 22a and a ground potential node. Node 22a is connected to gates of MOS transistors PTa, PTb and PTc.

When the spare memory array SMA is not used, the fuse element Fw remains conductive, and node 22a is at high voltage VPP level, and MOS transistors PTa, PTb and PTc are all turned off.

When the spare memory array SMA is used, the fuse element Fw is cut off, and the node 22a reaches the ground potential, and MOS transistors PTa–PTc are all turned on.

Figure 10:
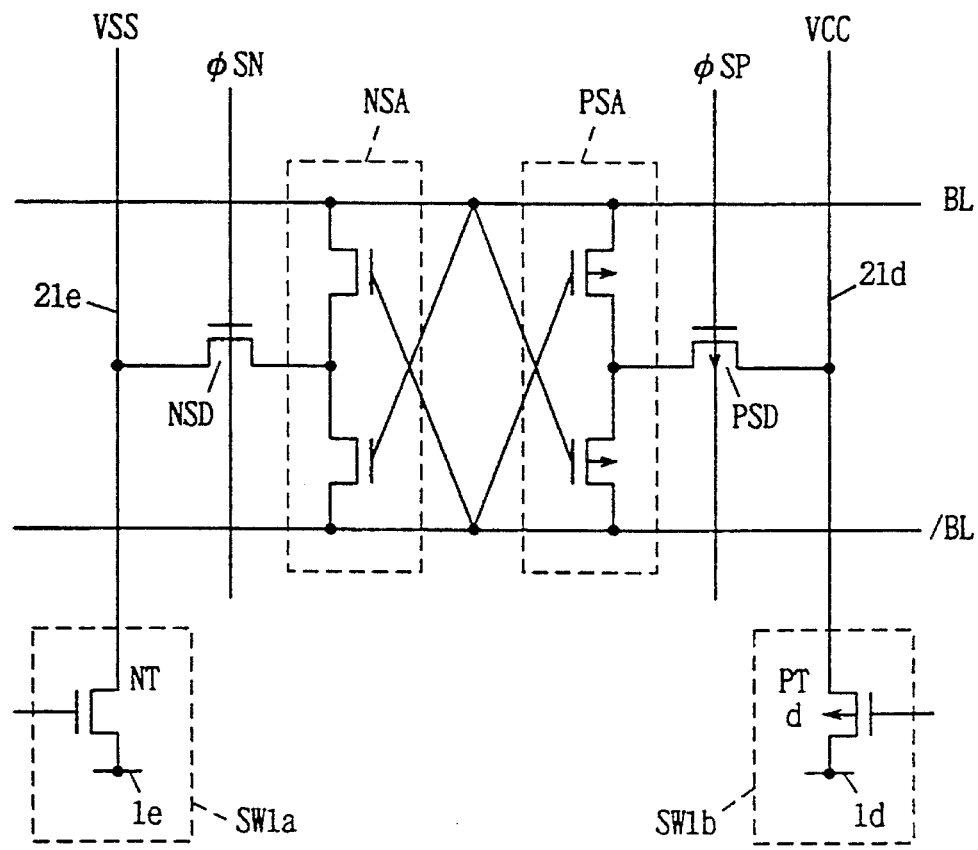
FIG. 10 shows a configuration of a sense amplifier and corresponding switching elements for supplying internal voltage.

FIG. 10 shows another arrangement of the switching element. In FIG. 10, a sense amplifier SA provided for a pair of bit lines BL and /BL includes an N sense amplifier NSA having cross-coupled n channel MOS transistors and a P sense amplifier PSA having cross-coupled p channel MOS transistors. N sense amplifier NSA receives ground potential Vss on a local ground line 21e through an n channel MOS transistor NSD responsive to an N sense amplifier activation signal $\phi$SN to be activated. P sense amplifier PSA receives the operating power supply voltage VCC on the local source line 21d through a p channel MOS transistor PSD responsive to a P sense amplifier activation signal $\phi$SP to be activated.

For the local ground line 21e, a switching element SW1a formed of an n channel MOS transistor NT is provided. For the local source line 21d, a switching element SW1b formed of a p channel MOS transistor PTd is provided. Switching elements SW1a and SW1b transmit the ground potential VSS on a ground line 1e and the operating power supply voltage VCC on a power line 1d to the line 21e and 21d, respectively, when they are turned on. Programming of switching elements SW1a and SW1b are performed by the program circuit 22 of FIG. 9 using an inverter for controlling the switching element SW1a.

Switching elements may further be provided for sense amplifier activation signals $\phi$SP and $\phi$SN.

Figure 11:
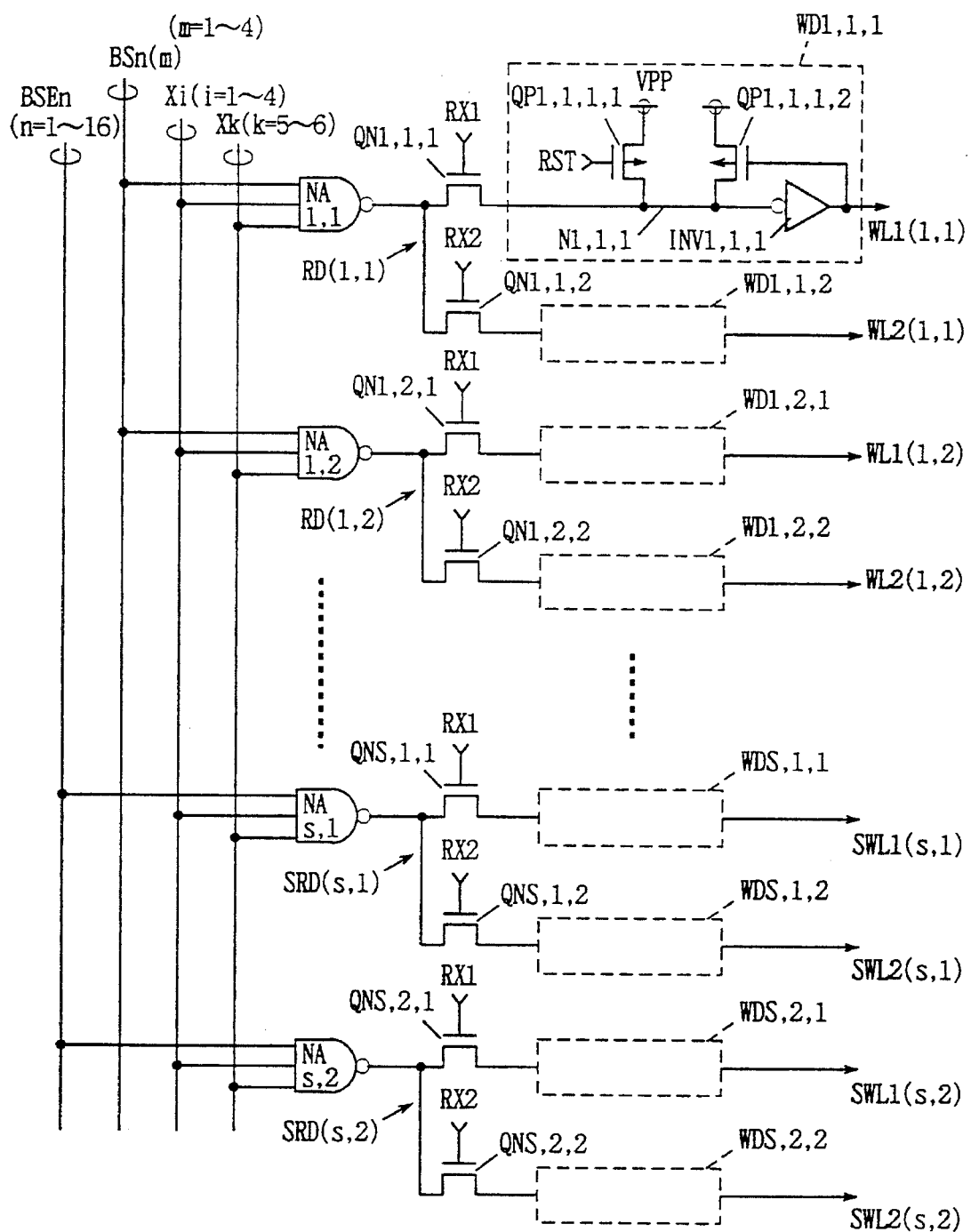
FIG. 11 shows an arrangement of row decoders and spare row decoders according to another embodiment of the present invention.

FIG. 11 schematically shows an alternative configuration of circuitry related to word line selection. In the arrangement of FIG. 11, two way scheme is applied to a row decoder RD(m, n) and a spare row decoder SRD(s, n).

Row decoder RD(m, n) is comprised of a NAND gate NAm.n receiving the signal BSn(m), one bit of the predecoded signal Xi (i=1–4), and one bit of a predecoded signal Xk (k=5–6). NAND gate NAm.n designates two adjacent word lines WL1(m, n) and WL2(m, n) at a time.

A two-way decoder for selecting one of two adjacent word lines WL1(m, n) and WL2(m, n) is provided at an output of NAND gate NAm.n. The two way decoder includes an n channel MOS transistor QNm.n.1 responsive to a way signal RX1 and provided for the word line WL1(m, n), and an n channel MOS transistor QNmon.2 responsive to another way signal RX2 and provided for the word line WL2(m, n). Way signals RX1 and RX2 are alternatively generated or activated. Way signal RX1 designates a group of word lines WL1(m, n) and the way signal RX2 designates a group of word lines WL2(m, n). Thus, one of MOS transistors Qmn1 and Qmn2 is turned on to transfer an output of NAND gate NAm.n.

Between the way decoder (transistor Qmn1 and Qmn2) and word lines WL1(m, n) and WL2(m, n) word drivers WDmn1 and WDmn2 are provided.

Word drivers WDmn1 and WDmn2 have the same configuration, and the configuration of only the word driver WD111 is shown in FIG. 11. Word driver WD111 includes an inverter INV1.1.1 for inverting and amplifying a signal received through MOS transistor QN1.1.1 from NAND gate NA1.1 for application onto a word line WL1(1,1), a p channel MOS transistor QP1.1.1.2 responsive to an output of inverter INV1.1.1 for transferring high voltage VPP to an input of inverter INV1,1,1, a p channel MOS transistor QP1.1.1.1 responsive to a reset signal RST for precharging the input of inverter INV1.1.1 to the high voltage VPP.

The signals BSEn, BSn(m), Xi, Xk, RX1 and RX2 are at the level of the operating power supply voltage VCC, and NAND gate NAm.n operates on the operating power supply voltage VCC.

Inverters INVm.n.1 and INVm.n.2 in the word drivers WDm.n.1 and WDm.n.2 operate on the high voltage VPP.

The signal RST goes low when a memory cycle completes, and goes high when a memory cycle starts.

For the spare word lines SWL1(s, n) and SWL2(s, n), a spare row decoder SRD(s, n) is comprised of a NAND gate NAs.n, a way decoder comprised of n channel MOS transistors QNS.n.1 and QNS.n.2, and word drives WDSn1 and WDSn2 are provided. MOS transistors QNS.n.1 and QNS.n.2 receive the way signals RX1 and RX2 at the gates, respectively.

Word line selection circuitry for a word line WL1(m, n) (or WL2(m, n)) has the same configuration as spare word line selection circuitry for a spare word line SWL1(s, n) (SWL2(s, n)). Now, operation will be described.

Upon standby mode, the reset signal RST is at a low level, and the inputs of inverters INVm.n.1 and INVm.n.2 are precharged to the high voltage VPP. The signals RX1 and RX2 are both at a low level, and MOS transistors QNm.n.2, QNS.n.1 and QNS.n.2 are all off.

When a memory cycle starts, the signal RST goes high. However, MOS transistor QPm.n.1.2 (QPm.n.2.2) is turned on to keep the input of inverter INVm.n.1 (INVm.n.2) at the high voltage VPP level.

According to an address signal, one of NAND gates NAm.n.1, NAm.n.2, NAs.n.1 and NAs.n.2 supplies a low level signal. Two way decoder selects one of word lines WL1(m,n) and WL2(m, n) or one of spare word lines SWL1(s, n) and SWL2(s, n) in response to the way signals RX1 and RX2. If NAND gate NA1.1 supplies a low level signal and the signal RX1 goes high, the input of inverter INV1.1.1 are discharged to the ground potential by NAND gate NA1.1, and inverter INV1.1.1 supplies the high voltage VPP level signal to the word line WL1(1, 1). Responsively, MOS transistor QP1.1.1.2 turns off.

If NAND gate NA(1, 1) supplies a high level signal at the operating power supply voltage level and the signal RX1 goes high, MOS transistor QN1.1.1 has the source and gate at the same potential and does not turn on. Thus, high voltage VPP is not transferred to NAND gate NA(1, 1).

When a spare row decoder SRD(s, n) is selected, the same operation is effected.

Way decoding scheme could provide the following advantages. NAND gate NAm.n or NAs.n is provided one for two word lines WL1(m, n) and WL2(m, n) or two spare word lines SWL1(s, 1) and SWL2(s, n), and the pitch of NAND gate NAm.n and NAs.n is relaxed.

Even if the number of word lines in a memory array is increased, for example to 32, NAND gate size does not increase. More specifically, three-input NAND gate can be employed as a row decoder for a memory array having 32 word lines.

Figure 12:
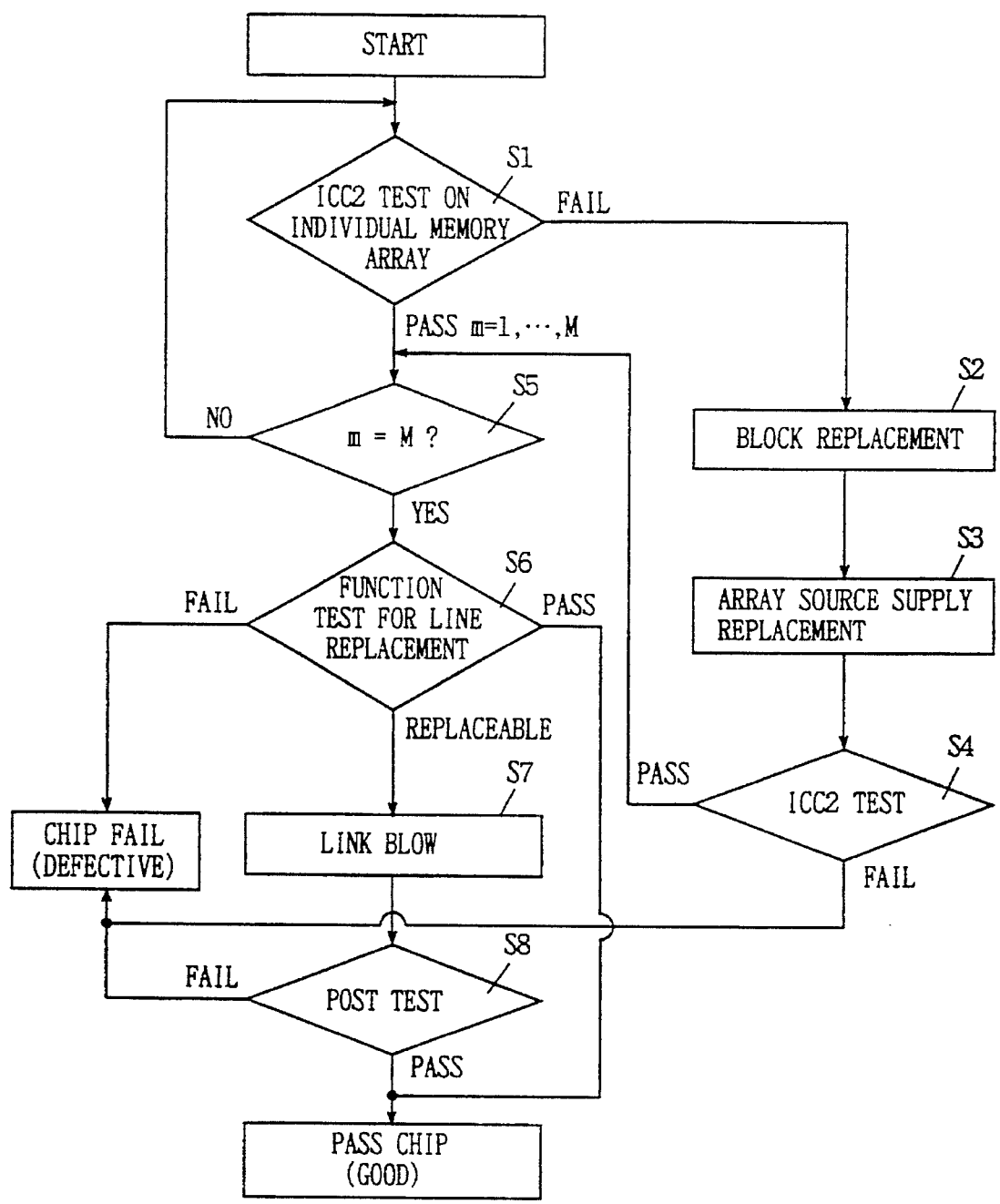
FIG. 12 shows a flow of steps of testing a semiconductor memory device according to the present invention.

FIG. 12 shows a flow of testing DRAM according to the present invention. Now, an operation of testing a semiconductor memory device to detect a defective array or a defective word line and repair the same will be described.

In step S1, Icc2 test is performed for the respective memory arrays MA1–MA4. In Icc2 test, it is checked whether a standby current Icc2 consumed by DRAM in a standby mode exceeds a predetermined value.

If a memory array MAm is found defective, the defective memory array MAm is replaced by the spare memory array SMA (step S2).

Then, the fuse element Fm is blown off and the switching element SW1 is turned on, and the replacement of internal source voltage is performed (step S3).

Icc2 test is then applied to the spare memory array SMA (step S4). In this case, the defective array address may be programmed upon the replacement by the spare memory array, or a spare array address may be generated. If this Icc2 test indicates the memory device is defective, the device is determined defective (chip fail) and is disposed.

If Icc2 test for the spare memory array indicates good, the remaining memory arrays are subject to Icc2 test (step S1 and S5). If another memory array is found defective, the other memory array cannot be repaired since the spare memory array is already used, and the memory device is determined defective and is disposed.

After the step S5, function tests such as a test in which checking is made whether memory cells correctly store data are made for individual word lines other than those in the defective memory array (step S6).

If a defective word line is found, it is first determined whether the defective word line can be replaced by a spare word line. If a corresponding spare word line is already used, the memory device is determined defective and is disposed. Even if memory array replacement is performed in step S2, the function tests are performed for the non-replaced memory array.

If the defective word line can be replaced by the spare word line, link blow for programming circuits of FIG. 2 is performed (step S7).

After the link blow for all the defective word lines is carried out for programming defective word line addresses, a post test for identifying that a defective word line is correctly replaced with a corresponding spare word line is effected (step S8).

If the memory device passes the tests in the step S6 or the step S8, the memory device is determined good (pass chip). If the memory device fails the test in the step S6 or the step S8, the memory device is determined defective (chip failure) and is disposed.

As described above, the memory device can be repaired in a memory array by memory array replacement and in a word line by word line replacement, the product yield can be enhanced.

In Icc2 test, a current flowing through power source pin is externally monitored, and the time for Icc2 test is negligible as compared to the time for the function tests, and therefore a total time for the redundancy testing is substantially the same as that for a conventional redundant scheme in which only a word line by word line replacement is effected.

Figure 13:
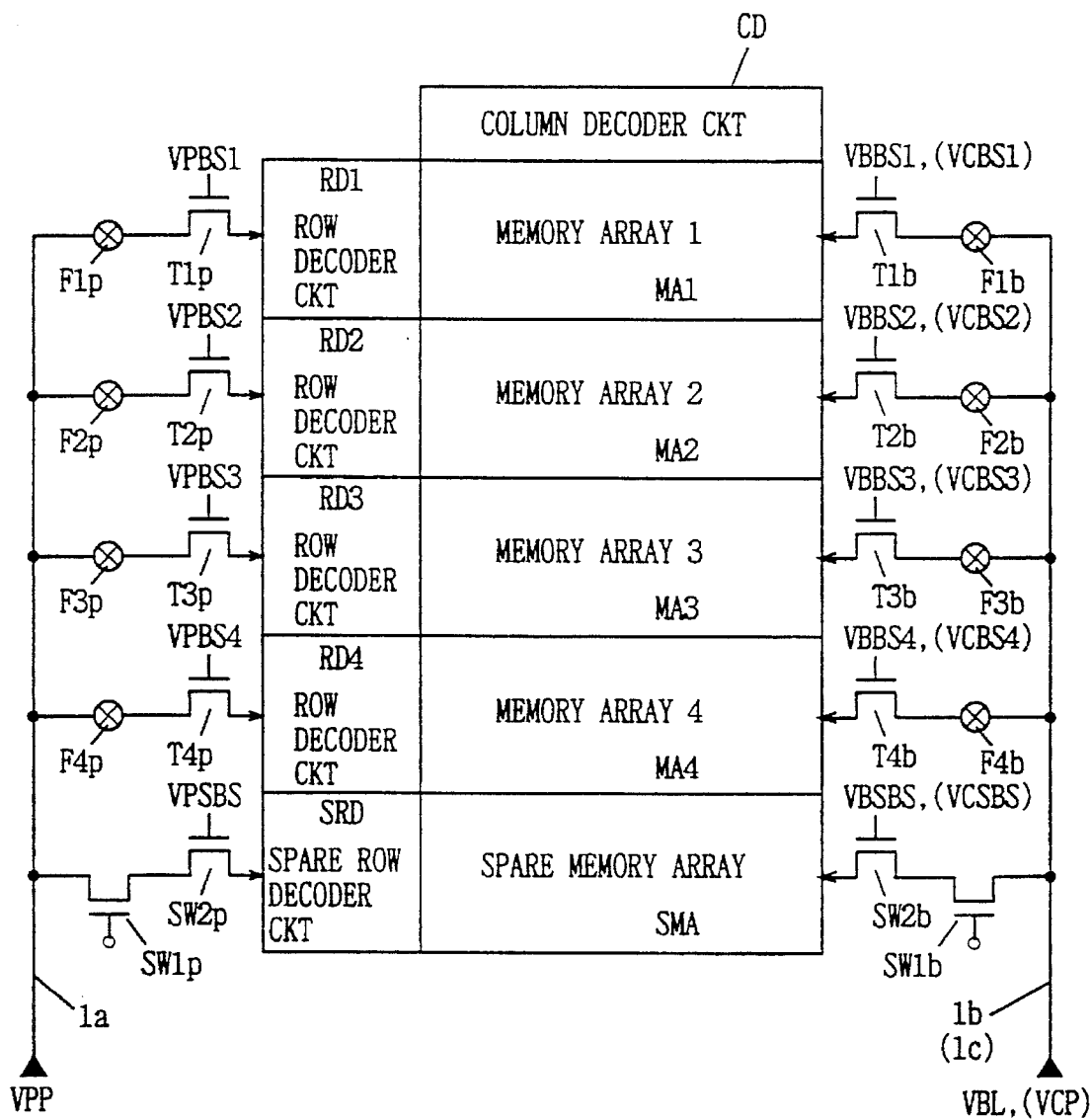
FIG. 13 shows an arrangement for implementing the testing flow shown in FIG. 12.

FIG. 13 shows an arrangement for Icc2 test on a memory array basis. Referring to FIG. 13, row decode circuits RD1–RD4 receive high voltage VPP on the source line 1a through fuse elements F1P–F4P via switching elements T1P–T4P, respectively. Switching elements T1P–T4P are shown being formed by n channel MOS transistors, but these switching elements T1P–T4P may be formed by p channel MOS transistors. Switching elements T1P–T4P are selectively turned on in response to control signals VPBS1–VPBS4, respectively.

Spare row decoder circuit SRD receives the high voltage VPP on the source line 1a through switching elements SW1P and SW2P. Switching element SW1P is programmed to be turned on or off, as shown in FIG. 9. Switching element SW2P selectively turns on in response to a control signal VPSBS.

Memory arrays MA1–MA4 receive the intermediate voltage VBL on the source line 1b through switching elements T1b–T4b via fuse elements F1b–F4b, respectively. Fuse elements F1b–F4b correspond to fuse elements F1–F4 as shown in FIG. 1. Switching elements SW1b–SW4b selectively turn on in response to control signals VBBS1–VBBS4.

Spare memory array SMA receives the intermediate voltage VBL through switching elements SW1b and SW2b. Switching element SW1b corresponds to the switching element SW1 of FIG. 1 or the element PTb of FIG. 9 and is programmed to be turned on. Switching element SW2b turns on in response to a control signal VBSBS when the spare memory array SMA is used. Switching elements T1b–T4b, SW1b and SW2b may be formed of p channel MOS transistors. The arrangement for cell plate voltage VCP is also provided, however this arrangement is not explicitly shown for the simplicity of illustration. Now, the operation will be described.

The control signals VPBS1–VPBS4, VPSBS, VBBS1–VBBS4 and VBBSBS are made active at a high level in a mode other than Icc2 test mode. Switching elements SW1P and SW1b are programmed to be turned on if the spare memory array is used.

In Icc2 test, only control signals VPBSm or VPSBS, and VBBSm or VBSBS are made active for a memory array or a spare memory array subject to Icc2 test. For example, if the memory array MA2 is subject to Icc2 test, only the control signals VPBS2 and VBBS2 (and VCBS2) are made active, and the other control signals are made inactive. At an exterior, a current flowing through the power pin (not shown) is monitored.

Figure 14:
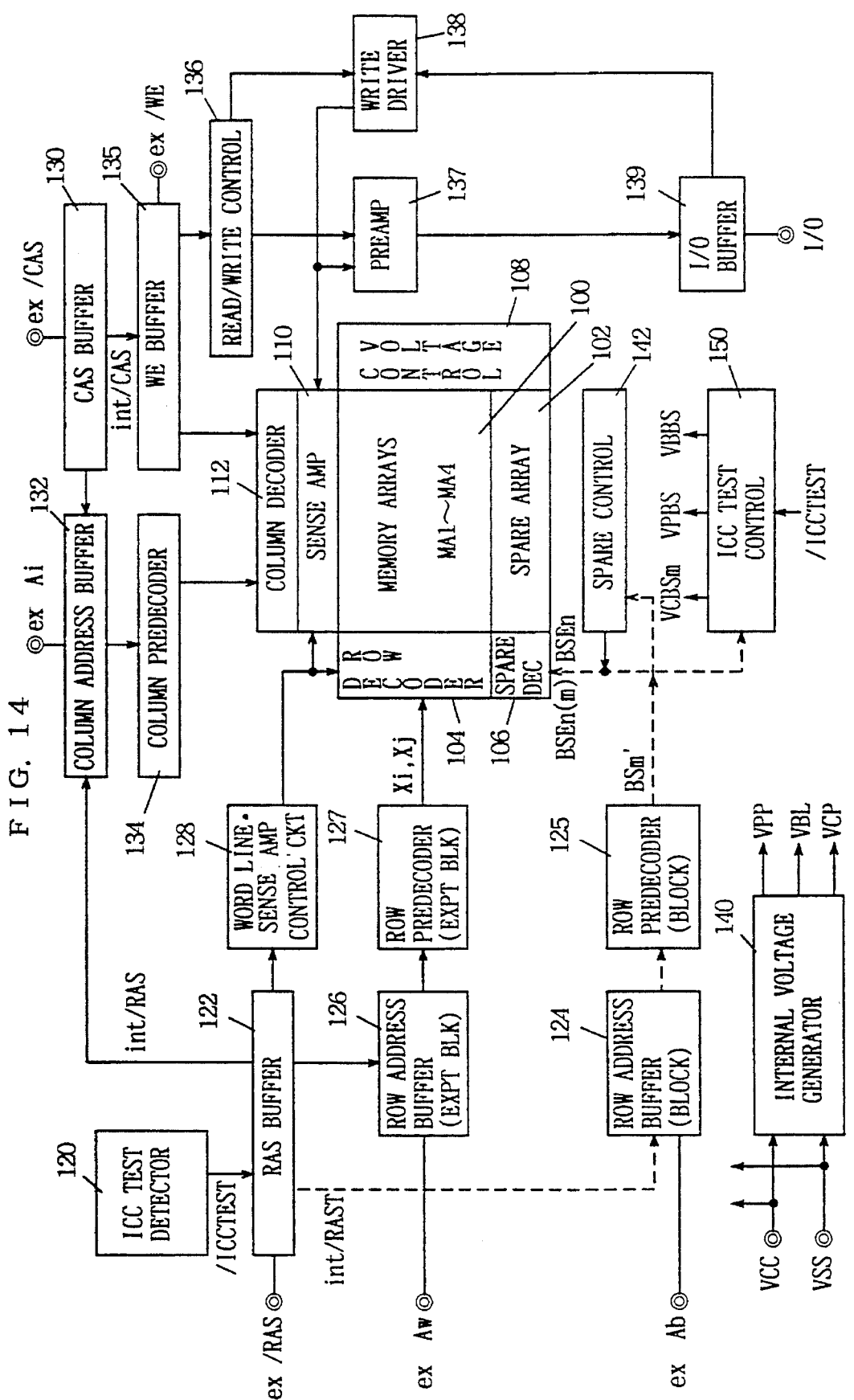
FIG. 14 shows an overall arrangement of a semiconductor memory device according to the present invention.

FIG. 14 shows an overall arrangement of the memory device according to the present invention. Referring to FIG. 14, the memory device includes a memory array portion 100 including memory arrays MA1–MA4, a spare array portion 102 including the spare memory array SMA, a row decoder circuit 104 including row decoders RD(m, n) (and word drivers WD), and a spare decoder circuit 106 including spare row decoders SRD(s, n). These components have the same arrangement as described previously.

The memory device further includes sense amplifier circuit 110 including sense amplifiers provided for each column (bit line pair) in the memory array portion 100 and the spare array portion 102, and a column decoder (CD) 112 for selecting a column or columns in the array portions 100 and 102.

Array portion 100 and 102 and decoder circuits 104, 106 are provided with a voltage control circuit 108 for supplying internal source voltages VPP, VBL and VCP on an array basis. The voltage control circuit 108 corresponds to fuse elements and switching elements shown in FIG. 13.

The memory device further includes an ICC test detector 120 for detecting that Icc2 test is designated, a RAS buffer 122 responsive to an external row address strobe signal ext/RAS and ICC test detecting signal/ICCTEST from ICC test detector 120 for generating internal row address strobe signals int/RAS and int/RAST.

The signal int/RAST changes according to the external row address strobe signal ext/RAS even in Icc2 test mode. The signal int/RAS is made inactive at a high level in Icc2 test mode, irrespective of the state of the external row address strobe signal ext/RAS.

The memory device further includes a row address buffer 124 responsive to the signal int/RAST for latching into an external address signal ex.Ab designating a memory array to generate an internal array address signal, a row predecoder 125 for predecoding the internal array address signal to generate the array request (designating) signal BSm' in response to the signal int/RAST, an address buffer 126 responsive to the signal int/RAS for latching into an external address signal exAw designating a word line to generate an internal row address signal, and a row predecoder 127 responsive to the signal int/RAST for predecoding the internal row address signal to generate row predecoded signals Xi and Xj. The row predecoded signals Xi and Xj are supplied to row decoder circuit 104 and spare decoder circuit 106.

The memory device further includes a CAS buffer 130 responsive to an external column address strobe signal ext/CAS for generating an internal column address strobe signal int/CAS, a column address buffer 132 responsive to the signals int/RAS and int/CAS for latching into an external column address signal exAi for generating an internal column address signal, a column predecoder 134 for predecoding the internal column address signal to generate a column predecode signal for application to the column decoder 112.

A word line/sense amplifier control circuit 128 responds to the signal int/RAS from RAS buffer 122 for controlling activation/deactivation of decoder circuits 104 and 106 and the sense amplifier circuit 110.

The memory device further includes a WE buffer 135 responsive to the internal column address strobe signal int/CAS and an external write enable signal ex/WE for generating a column decoder enabling signal and a read/write mode designating signal, a read/write control circuit 136 responsive to the read/write mode designating signal for generating a read control signal and a write control signal, a preamplifier 137 responsive to the read control signal for amplifying a data read from a selected memory cell for application to an I/O buffer 139, and a write driver 138 responsive to the write control signal for writing a data received from I/O buffer 138 into a selected memory cell. I/O buffer 139 supplies and receives external data.

The memory device further includes an internal voltage generator 140 for generating internal voltages VPP, VBL and VCP, an ICC test control circuit 150 responsive to the signal/ICCTEST and the array request signal BSm' for generating ICC array designating signals VCBS, VBBS and VPBS, or the signals VCBSm and VCSBS, VBBSm and VBSBS, and VPBSm and VPSBS, respectively.

A spare control circuit 142 corresponds to program circuits 10 and 12 shown in FIG. 2. Gate circuit 15 for generating the array designating signal BSn(m) is not explicitly shown in FIG. 14.

Internal voltage generator 140 may include a voltage down converter for down-converting an external power supply voltage to generate an internal power supply voltage.

In the arrangement of FIG. 14, in Icc2 test mode, the signal int/RAS is kept inactive, and the address buffer 126, row predecoder 127, row decoder circuit 104, and column selection circuitry such as column address buffer 132 and column decoder 112 do not operate even if the external row address strobe signal ext/RAS goes low.

The signal int/RAST changes according to the signal ext/RAS even in Icc2 test mode, and the address buffer 124 and row predecoder 125 operate to generate the array request signal BSm' according to an external address signal exAb. Thus, in Icc2 test mode, Icc test control circuit 150 generates the control signals VCBS, VPBS and VBBS according to the array request signal BSm', and only a designated memory array or spare memory array receives internal voltages VPP, VBL and VCP and is subject to Icc2 test.

Figure 15:
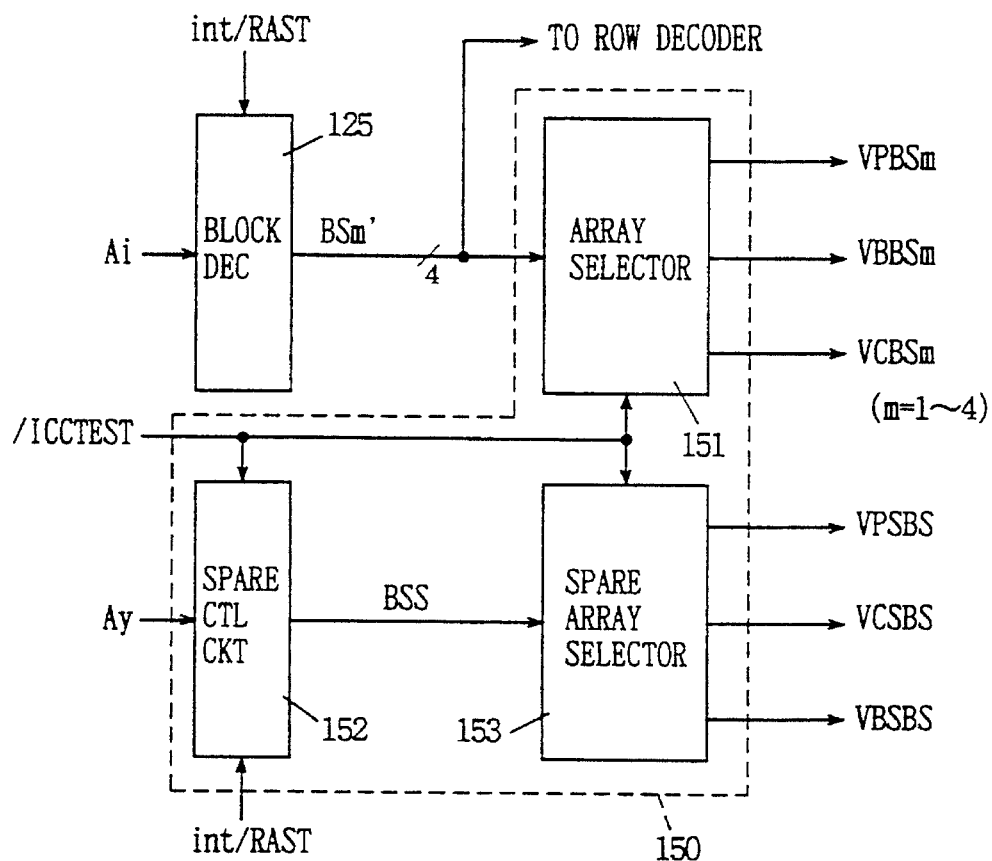
FIG. 15 shows a configuration of the test control circuitry shown in FIG. 14.

FIG. 15 shows a structure of Icc test controller 150 shown in FIG. 14. Referring to FIG. 15, the controller 150 includes an array selector 151 responsive to the signals/ICCTEST and BSm' for generating the signals VPBSm, VBBSm and VCBSm, a spare control circuit 152 responsive to the signals int/RAST, /ICCTEST and to the address signal(s) Ay for generating a spare array designating signal BSS, and a spare array selector 153 responsive to the signals BSS and /ICCTEST for generating the signals VSBS, VCSBS and VBSBS for the spare memory array SMA.

The selectors 151 and 153 are activated when the signal/ICCTEST is active at a low level. When the signal/ICCTEST is inactive at a high level, the selectors 151 and 153 are disabled or deactivated, and the signals VPBSm, VCBSm, VBBSm, VPSBS, VBSBS, and VCSBS are maintained at a high level. Such logic for the selectors 151 and 153 can be implemented by OR gate receiving the signals BSm' (BSS) and /ICCTEST.

Spare control circuit 152 generates the spare array designating signal BSS when the address signal(s) Ay other than a block address is brought into a predetermined state upon activation of the signals/ICCTEST and int/RAST. The spare control circuit 152 may include a decoder. The signal Ay may be supplied through unused pin, or may be generated depending on a combination of the states of predetermined signals (control signals and/or address signals).

Array selector 151 is provided for each of memory arrays MA1–MA4.

Figure 16:
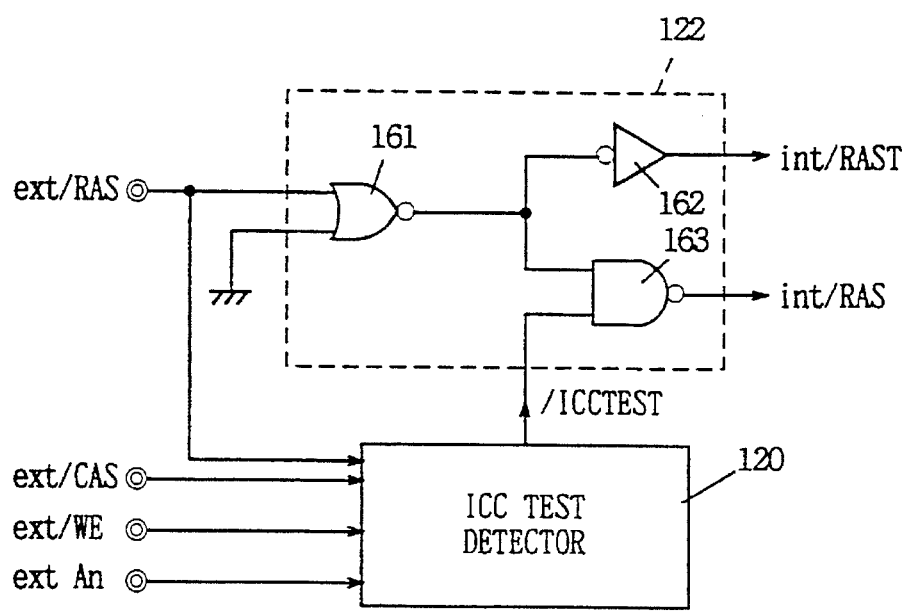
FIG. 16 shows a configuration of a RAS buffer shown in FIG. 14.

FIG. 16 shows RAS buffer 122 of FIG. 14. Referring to FIG. 16, RAS buffer 122 includes a NOR gate 161 receiving a ground potential and the external row address strobe signal ext/RAS, an inverter 162 receiving an output of NOR gate 161 to generate the signal int/RAST, and a NAND gate 163 receiving the output of NOR gate 161 and the signal/ICCTEST from ICC test detector 120 to generate the signal int/RAS. Now, the operation of RAS buffer 122 will be described with reference to FIG. 17 which is a waveform diagram for RAS buffer 122.

If the signal/ICCTEST is at a high level, NAND gate 163 serves as an inverter, and the signals int/RAS and int/RAST both change according to the external row address strobe signal ext/RAS.

In Icc2 test mode, the signal/ICCTEST is rendered active at a low level, and NAND gate 163 maintains the signal int/RAS at a high level irrespective of the state of the external row address strobe signal ext/RAS. The signal int/RAST changes according to the signal ext/RAS.

When the signal ext/RAS goes low, the signal int/RAST goes low and the (array) address signal ext.Ab is latched and the array request signal BSm' is generated through the address buffer 124 and row predecoder 125.

In order to bring the address buffer 124 and row predecoder 125 into a standby state in Icc2 test mode, a latch circuit may be provided for latching the outputs of the array selectors 151 and 153 of FIG. 15.

FIG. 18 shows a structure of ICC test detector 120 of FIGS. 14 and 16. Referring to FIG. 18, ICC test detector 120 includes a test mode detector 170 responsive to the signals ext/RAS, ext/CAS and ext/WE for generating a test mode designating signal TE, and an ICCTEST generator 172 responsive to the signal TE and a particular address signal ext An for generating the Icc2 test mode designating signal/ICCTEST. Now, the operation of ICC test detector 120 will be described with reference to the operation diagram thereof of FIG. 19.

Test mode detector 170 detects the write CAS before RAS state in which the signals ext/WE and ext/CAS are both at a low level when the signal ext/RAS goes low, to generate or activate the test mode designating signal TE at a high level. The write CAS before RAS state is well known in DRAM art and is a JEDEC (Joint Electronic Device Engineering Council) standard for designating a test mode.

The ICCTEST generator 172 is activated by the active test mode designating signal TE. When the particular address signal ext An rises to a super VIH level higher than a normal high level of the signal ext An under this state, the generator 172 renders the signal/ICCTEST active at a low level.

In the arrangement of FIG. 18, the signal/ICCTEST is generated by the combination of the write CAS before RAS (WCBR) cycle and an address key.

Alternatively, an optional pad may be provided for receiving and generating the signal/ICCTEST, and Icc2 test may be performed in a wafer test in which all chips on a wafer are checked.

FIG. 20A shows a configuration for one bit of row address buffer 126 shown in FIG. 14. Referring to FIG. 20A, a row address buffer circuit (126) includes a transmission gate 181 responsive to complementary address latch enable signals ALC and /ALC for transferring the external address signal ext Aw onto a signal line 186, a latch 182 including cascaded two inverters for latching a signal on the signal line 186, an inverter 183 for inverting the signal on the signal line 186, NOR gate 184 receiving an address enable signal /AE and the signal on the signal line 186, and NOR gate 185 receiving the address enable signal /AE and an output of inverter 183. NOR gate 185 supplies an internal address signal Aw, and NOR gate 184 supplies a complementary internal address signal /Aw. Generation of signals ALC, /ALC, AE and /AE will be described later, however, these signals ALC, /ALC, AE and /AE are generated in response to the signal int/RAS.

In a standby state in which the signal int/RAS is inactive, the signals /ALC and /AE are both at a high level. In this state, the transmission gate 181 is turned off, and NOR gates 184 and 185 supply the signals /Aw and Aw at low levels.

In an active cycle, the signal ALC and /ALC are generated in a one-shot pulse form, and transmission gate 181 turns on for a predetermined period. Thus, the signal ext Aw is latched by the latch 182. When the signal /AE goes low, NOR gates 184 and 185 operate as inverters to generate internal address signals /Aw and Aw, respectively.

FIG. 20B shows a configuration of one bit of row (array) address buffer 124. The row address buffer circuit (124) has the same configuration as the row address buffer circuit 126 shown in FIG. 20A. Only the applied signals are different.

Transmission gate 191 transmits an external (array) address signal ext Ab onto a signal line 196 when the array address latch enable signals ALCB and /ALCB are at the high and low levels, respectively.

A latch 192 latches the signal on the signal line 196.

NOR gates 194 and 195 supplies internal array address signals /Ab and Ab according to the latched address signal extAb when an array address enable signal /AEB is at a low level. NOR gate 194 and 195 supply low level signals when the signal /AEB is at a high level in a standby state. An inverter 193 inverts the signal on the signal line 196 for application to NOR gate 195. The signals ALCB, /ALCB and AEB are generated in response to the signal int/RAST.

FIG. 21A shows a structure for generating the signals ALC and ALCB. Since the signals ALC and ALCB are generated by the circuits having the same configuration, only the configuration for generating the signal ALC is shown in FIG. 21A. Referring to FIG. 21A, the arrangement includes a delay 200 for delaying the signal int/RAS (int/RAST) for a predetermined time, an inverter 201 for inverting an output of the delay 200, a NOR gate 202 receiving the signal int/RAS (int/RAST) and an output of inverter 201, and an inverter 203 for inverting an output of NOR gate 202. NOR gate 202 supplies the latch enable signal ALC (ALCB), and the inverter 203 supplies the complementary latch enable signal/ ALC (/ALCB). Now, the operation of the circuit shown in FIG. 21A will be described with reference to FIG. 21B.

When the signal int/RAS (int/RAST) is at a high level, the signal ALC from NOR gate 202 is at a low level.

When the signal int/RAS (int/RAST) goes low, outputs from delay 200 and inverter 201 go low and high, respectively, after a predetermined time. NOR gate 202 supplies a high level signal when the signal int/RAS (int/RAST) and an output of inverter 201 both are at the low level. Thus, the signal ALC (ALCB) is at a high level for the predetermined time determined by delay 200 since the falling of the signal int/RAS (int/RAST).

FIG. 22A shows a configuration of circuits for generating the signals /AE and /AEB. Since the address enable signals /AE and /AEB are generated by the circuits having the same configuration, only one circuit configuration is shown in FIG. 22A.

Referring to FIG. 22A, the arrangement includes an inverter 210 receiving the signal int/RAS (int/RAST), a delay 211 delaying an output of the inverter 210, and a NAND gate 212 receiving the output of inverter 210 and an output of the delay 211. NAND gate 212 supplies the signal /AE (/AEB). Now, the operation of the arrangement of FIG. 22A will be described with reference to an operation waveform diagram of FIG. 22B.

When the signal int/RAS (int/RAST) is at a high level, an output of inverter 210 is at a low level, and the signal /AE(/AEB) from NAND gate 212 is at a high level.

When the signal int/RAS (int/RAST) goes low, the output of inverter 210 goes high. When the output of the delay 211 goes high, NAND gate 212 receives the high level signals at both inputs, and the signal /AE (/AEB) goes low. When the signal int/RAS (int/RAST) goes high, the signal /AE (/AEB) goes high.

Figure 23:
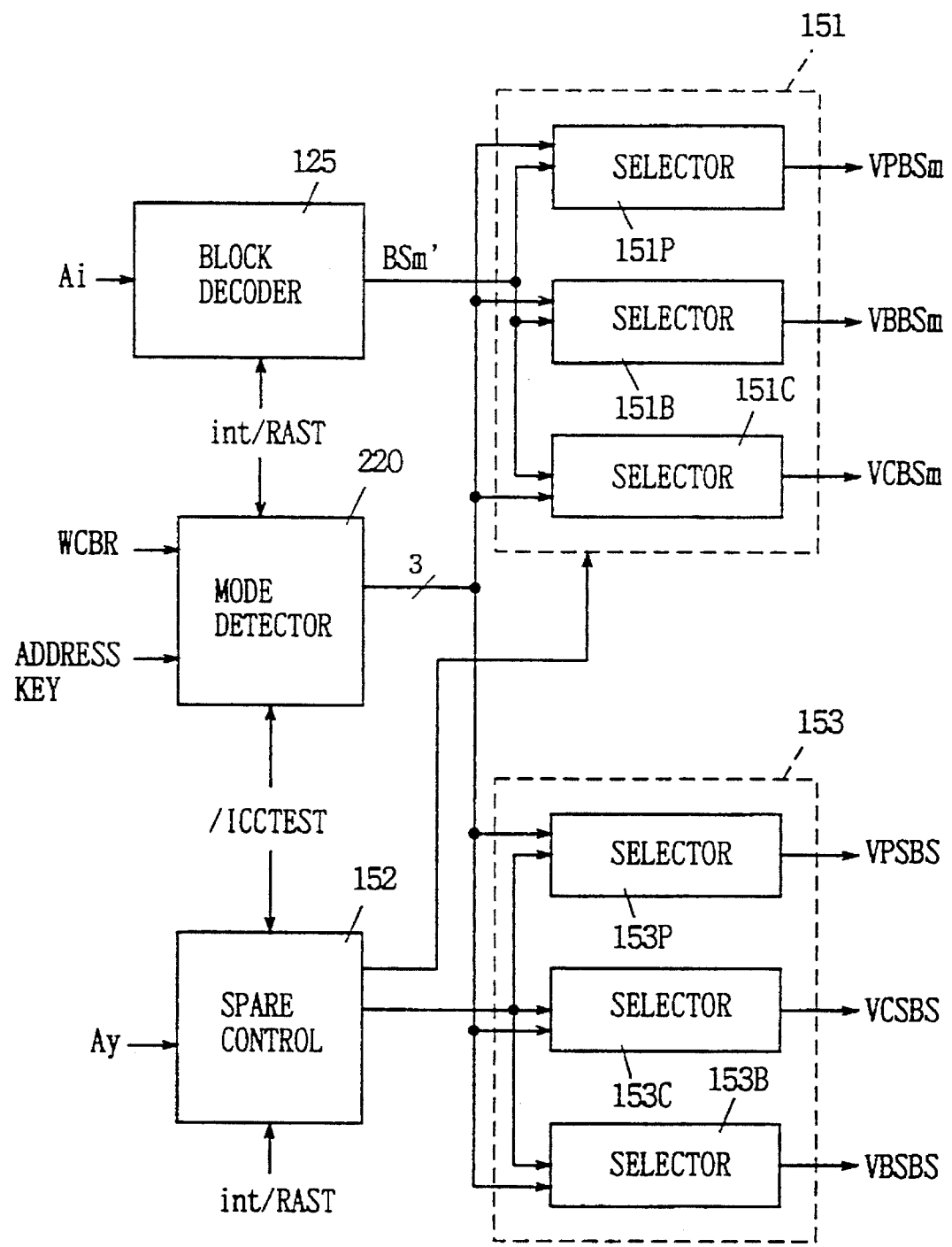
FIG. 23 shows another arrangement of ICC test control circuit shown in FIG. 14.

FIG. 23 shows another embodiment of the present invention. More specifically, FIG. 23 shows another configuration of ICC test control circuit 150. Referring to FIG. 23, a mode detector 220 is provided for determining which test mode among high voltage VPP test mode, intermediate voltage VBL test mode and cell plate voltage VCP test mode is designated in response to the signal WCBR and an address key. Mode detector 220 is enabled by the signal /ICCTEST, and latches into the signal WCBR and the address key in response to the signal int/RAST. The signal WCBR corresponds to the signals ext/RAS, ext/CAS and ext/WE set in the write CAS before RAS state. The address key indicates particular address signals.

Array selector 151 includes a high voltage mode array selector 151P, an intermediate voltage array selector 151B, and a cell plate voltage array selector 151C. One of the selectors 151P, 151B and 151C is enabled in response to the output of mode detector 220. The selectors 151P, 151B and 151C supply control signals VPBSm, VBBSm and VCBSm, respectively according to the array request signal BSm' and the output of mode detector 220.

Spare array detector 153 includes a spare array selector 153P for high voltage VPP, a spare array selector 153B for the intermediate voltage VBL, and a spare array selector 153C for the cell plate voltage VCP. One of selectors 153P, 153B and 153C is enabled according to the output of mode detector 220. Selectors 153P, 153B and 153C supply control signals VPSBS, VBSBS and VCSBS, respectively in response to the output of the spare control circuit 152 when they are enabled.

In Icc2 test mode, high voltage VPP mode, intermediate voltage VBL mode and cell plate voltage VCP mode may be sequentially carried out for each memory array, or one test mode is carried out for all the memory arrays, and then another test mode of VPP, VBL and VCP is carried out for all the memory arrays.

According to the FIG. 23 arrangement, leakage current components in Icc2 test can be classified for each of VPP source, VBL source and VCP source, so that analysis of defect can be advantageously performed.

In the arrangements of FIGS. 15 and 23, when the spare memory array is selected in Icc2 test mode, the array selector 151 is disabled based on an output of spare control circuit 152 although explicitly not shown but shown by a dotted arrow in FIG. 23.

The arrangements of FIGS. 15 and 23 can be readily extended to the arrangement including a plurality of spare arrays in which the spare control circuit 152 selects a spare memory array. The spare controller 152 may not be provided. If the spare controller 152 is not provided, an array request signal BSm' indicating a memory array which is replaced by the spare array is transferred to the spare array selector 153 by programming fuse elements upon block replacement on the step S2 of FIG. 12.

Figures 24A, 24B:
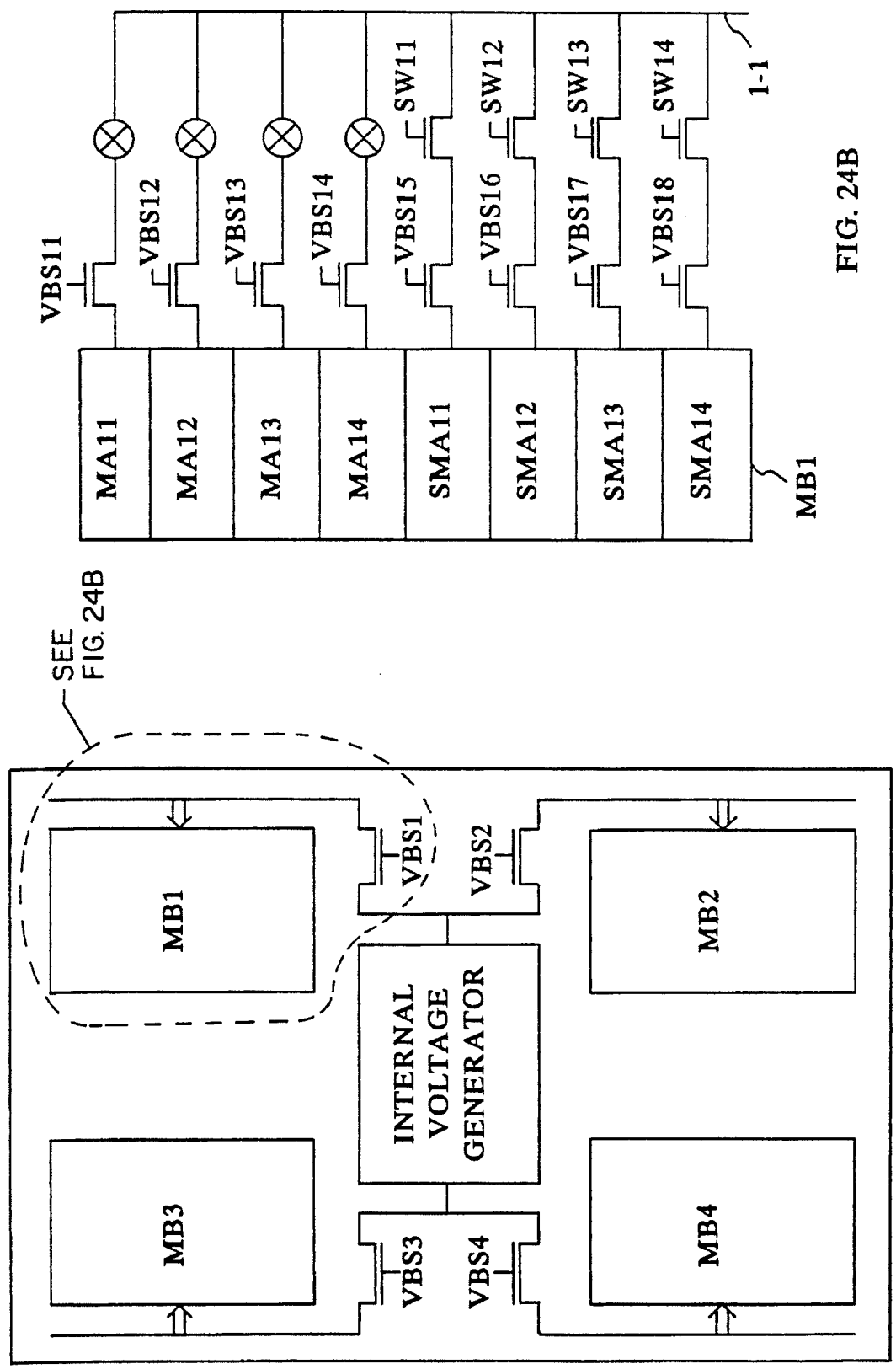
FIGS. 24(a)–24(b) show a schematic overall arrangement of another embodiment of the present invention.

FIG. 24 shows further another embodiment of the present invention. Referring to FIG. 24, the memory device includes four memory blocks MB1–MB4. Each of memory blocks MB1–MB4 includes four memory arrays MAbm (b=1–4, m=1–4) and four spare arrays SMAbm. Accessing or selection of memory blocks and memory arrays is determined depending on data input/output configuration.

Memory array MAbm receives an internal voltage such as VPP, VBL and VCP on the source line 1-$b$ through a switching element TZbm, and a spare memory array SMAbm also receives the internal voltage on the source line 1-$b$ through a switching element TZb(m+4).

Switching elements TZb1–TZb8 turns on in response to an 8-bit control signal VBSb.

Figure 25:
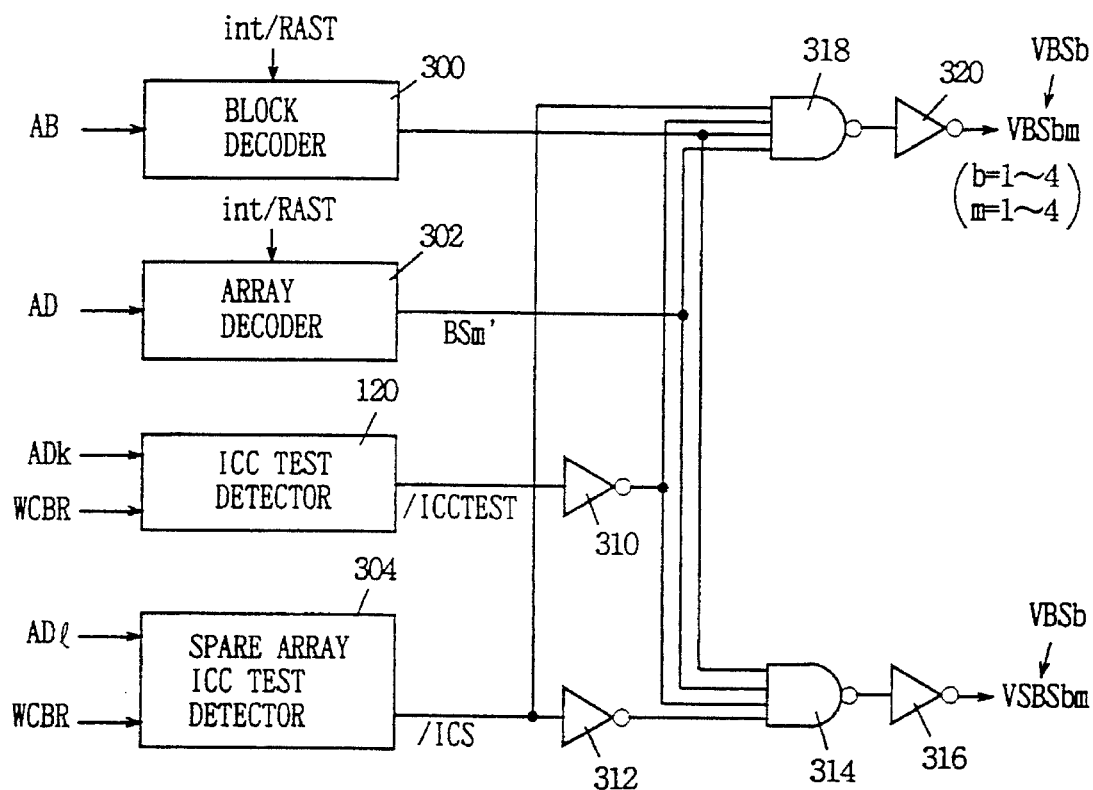
FIG. 25 shows an arrangement for controlling the switching elements shown in FIG. 24.

FIG. 25 shows a configuration for generating control signals for supplying internal voltage such as VPP, VBL and VCP for the arrangement of FIG. 24. Referring to FIG. 25, a block decoder 300 receives a block address signal AB designating a memory block MB (MB1–MB4) to generate an internal block designating signal in response to the signal int/RAST.

An array decoder 302 corresponds to the block decoder 125 of FIG. 14, receives an array address signal AD and generates an internal array request signal BSm' designating a memory array MAbm in each memory block in response to the signal int/RAST.

ICC test detector 120 corresponds to the detector 120 of FIGS. 14 and 18, and generates the Icc2 test mode designating signal /ICCTEST in response to an address key ADk and the signal WCBR indicating the write CAS before RAS condition.

A spare array ICC test detector 304 detects that a spare array is request to be subject to Icc2 test in response to an address key Adl and the signal WCBR.

A control signal VBSbm for the memory array MAbm in the memory block MBb is generated by a NAND gate 318 and an inverter 320. NAND gate 318 receives the memory block designating signal from block decoder 300, the array request signal BSm', the Icc2 test mode designating signal /ICCTEST through an inverter 310, and a spare array request signal /ICS from the spare array ICC test detector 304.

The inverter 320 receives an output of NAND gate 318 to generate the control signal VBSbm.

A control signal VSBSbm for the spare memory array SMAbm in the memory block MBb is generated by a NAND gate 314 and an inverter 316.

NAND gate 314 receives the block designating signal from block decoder 300, the array request signal BSm', the Icc2 test mode designating signal /ICCTEST through inverter 310, and the spare array request signal /ICS through the inverter 312. Now, the operation of the arrangement of FIG. 25 will be described.

Block decoder 300 and array decoder 302 each decode applied address signals when the external row address strobe signal ext/RAS goes low. In the arrangement of FIG. 25, the internal row address strobe signal int/RAS is controlled by the signal /ICCTEST to inhibit memory cell selection operation. The signal int/RAST of FIG. 16 is employed to inhibit any memory cell selection operation other than the memory block and array selection operation.

When the Icc2 test mode is designated by the address key ADk and the signal WCBR, the signal /ICCTEST from the detector 120 goes low, and the output of inverter 310 goes high. If a spare array is not designated, the signal /ICS is at a high level. Therefore, a memory array MAbm designated by the array request signal BSm' in the memory block designated by the block designating signal is subject to Icc2 test because the signal VBSbm goes high. Meanwhile, since the signal /ICS is at a high level, NAND gate 314 is disabled, and the signal VSBSbm is at a low level.

If a spare array is designated, the signal /ICS goes low and NAND gate 318 is disabled, and the signal VBSbm is at a low level.

Inverter 312 supplies a high level signal and NAND gate 314 supplies a low level signal according to the outputs of the decoders 300 and 302. A spare memory array SMAbm designated by the array request signal BSm' in the memory block MBb designated by the block designating signal is subject to Icc2 test.

If Icc2 test is not performed, the signal /ICCTEST goes high. In a functional test, any memory array MAbm or spare memory array SMAbm receives the internal voltage. In order to implement such arrangement, an OR gate receiving the signal /ICCTEST at one input is provided at an output of each of inverters 320 and 316.

If a defective spare array is found, the defective spare array is isolated from any source line by cutting off fuse element. Here, although in the arrangement of FIG. 24, fuse elements are not explicitly shown, fuse elements are provided in series with switching elements TZbm.

Figure 26:
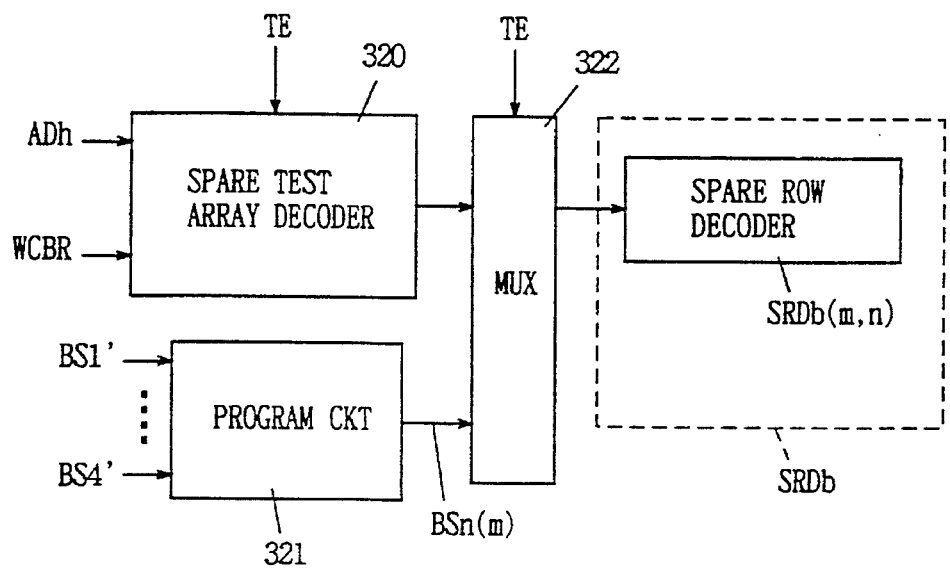
FIG. 26 shows schematically an arrangement for implementing a function test and Icc2 test.

FIG. 26 shows an arrangement for implementing a function test of the spare memory arrays SMAbm. Referring to FIG. 26, a spare test array decoder 320 is enabled by the test mode designating signal TE and generates a spare array designating signal according to the signal WCBR and a particular address key.

A program circuit 321 corresponds to the program circuits 10 and 12 shown in FIG. 2 and generates a programmed spare array designating signal. The program circuit 321 is provided for each spare row decoder SRDb(m,n).

A multiplexer 322 selects one of the outputs of spare test decoder 320 and program circuit 312 in accordance with the test mode designating signal TE. Upon a function test mode, the test mode designating signal TE is made active, and the multiplexer 322 selects the output of spare test array decoder 320.

A spare row decoder SRDb (m, n) is provided for each spare word line WLb(s, n). The spare row decoder SRDb(m, n) receives an output of a row predecoder as shown in FIG. 14 at 127. The row predecoder is provided for each of memory blocks MB1–MB4. Only a row predecoder for a memory block designated by a block address signal is enabled, and thus a function test of a memory array or a spare memory array in a designated memory block is effected.

In the arrangement described above, only one memory block is designated at a time. However, four memory blocks MB1–MB4 may be designated at a time for inputting and outputting of multibit data. In such arrangement, the block decoder 300 of FIG. 25 may be replaced with a decoder responsive to a particular address key to select one of memory blocks MB1–MB4, like the spare test array decoder 320 of FIG. 26.

In the arrangement of FIG. 24, a memory block MBb may include eight or more memory arrays, and the number of the spare memory arrays in a memory block is not limited to 4. In addition, a memory array and a spare memory array may include word lines more than 16.

Figure 27:
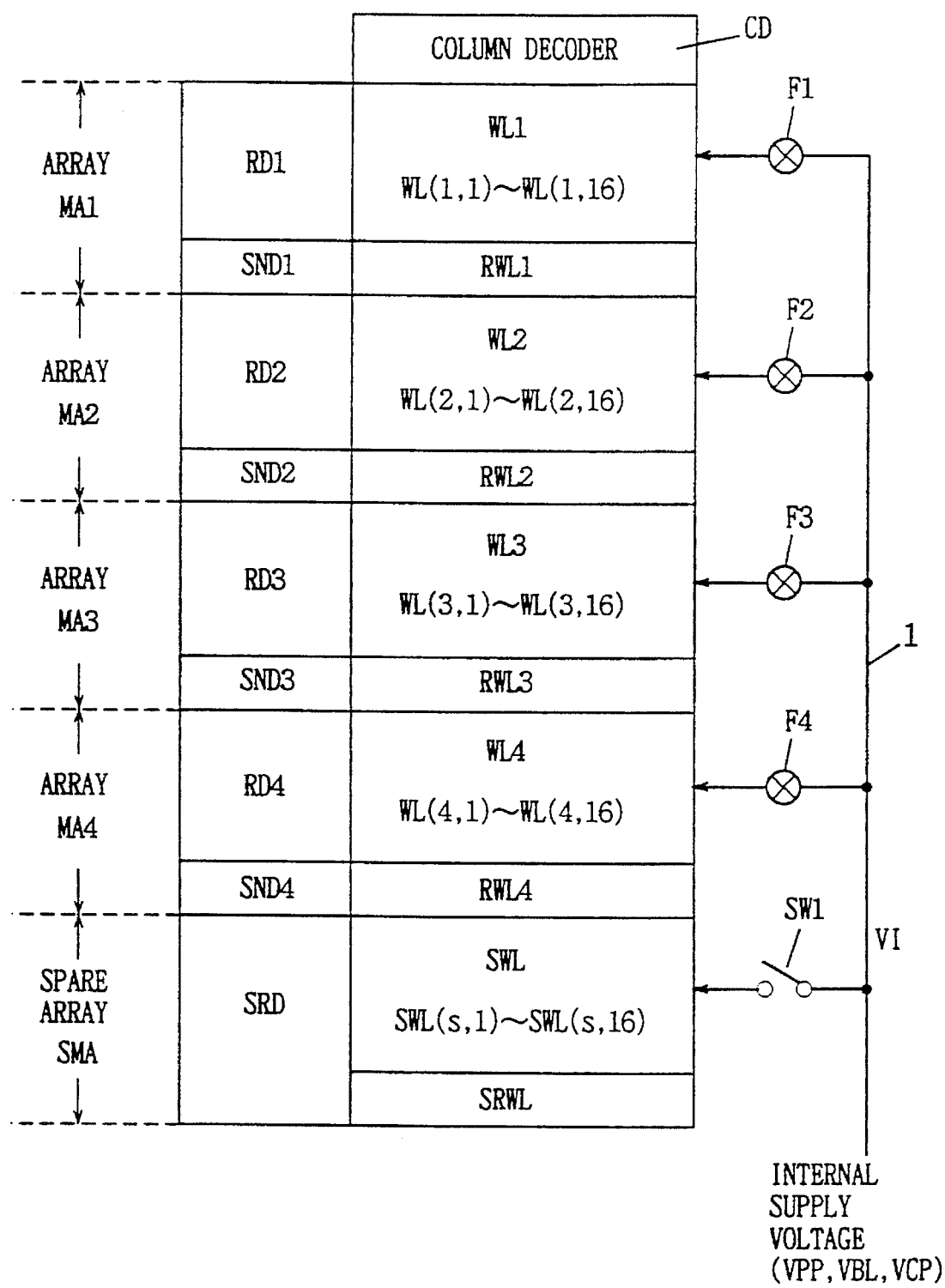
FIG. 27 shows a schematic overall arrangement of a semiconductor memory device according to a further another embodiment of the present invention.

FIG. 27 shows a schematic overall arrangement according to a still further another embodiment of the present invention. In the arrangement of FIG. 27, each of memory arrays MA1 through MA4 includes a normal word line region WLm (m=1–4) and a redundant word line region SNWLm. Spare memory array SMA includes a spare word line region SWL and a spare redundant region SRWL.

Memory array MA1–MA4 and spare memory array SMA have the same arrangement, and normal word line regions WL1–WL4 each have a plurality of (16, for example) normal word lines corresponding in one to one correspondence to spare word lines in spare word line region SWL included in spare memory array SMA, similarly to the embodiments described previously.

Redundant word line in a redundant word line region RWLm can be replaced only with a normal word line in a corresponding normal word line region WLm. A spare redundant word line in a spare redundant word line region SRWL can be replaced only with a spare word line in the spare word line region SWL. The redundant word line regions RWL1–RWL4 and SRW1 each may include one or more redundant word line(s).

Normal word line regions WL1–WL4 are provided with row decoder blocks RD1–RD4, respectively, and redundant word line regions RWL1–RWL4 are provided with redundant row decoder blocks SND1–SND4. Row decoder blocks RD1–RD4 each include normal row decoders provided for the respective normal word lines in the corresponding normal word line regions WL1–WL4. These row decoders each have the same configuration as shown in FIG. 5. Redundant row decoder blocks SND1–SND4 each include redundant row decoder(s) provided corresponding to redundant word line(s) in the corresponding redundant word line region RWL1–RWL4. The detailed configuration of redundant row decoders and the replacement of a normal word line with a redundant word line will be described later.

Spare word line region SWL and spare redundant word line region SRWL are provided in common with a spare row decoder block SRD. The block SRD includes spare row decoders provided for the respective spare word lines SWL(s, 1)–SWL(s, 16) in the spare word line region SWL and for spare redundant word line(s) in the spare redundant word line region SRWL. The spare row decoders each have the same configuration as shown in FIG. 6.

Memory arrays MA1–MA4 are supplied with internal supply voltage VI (VPP, VBL, VCP) on the transmission line 1 through fusible link elements F1–F4, respectively. Spare memory array SMA is supplied with the internal supply voltage VI through a switching element SW1.

Cutting off of the link elements and setting of on and off of switching element SW1 is effected in the same way as described with reference to FIG. 1. Now, repairing of a "defective" normal word line in the arrangement of FIG. 27 will be described.

Now, it is assumed for the simplicity of explanation that the redundant word line regions RWL1–RWL4 each include a single redundant word line RWL(m, 1) and the spare redundant word line region SRWL includes a single spare redundant word line SRWL(s, 1).

Figure 28:
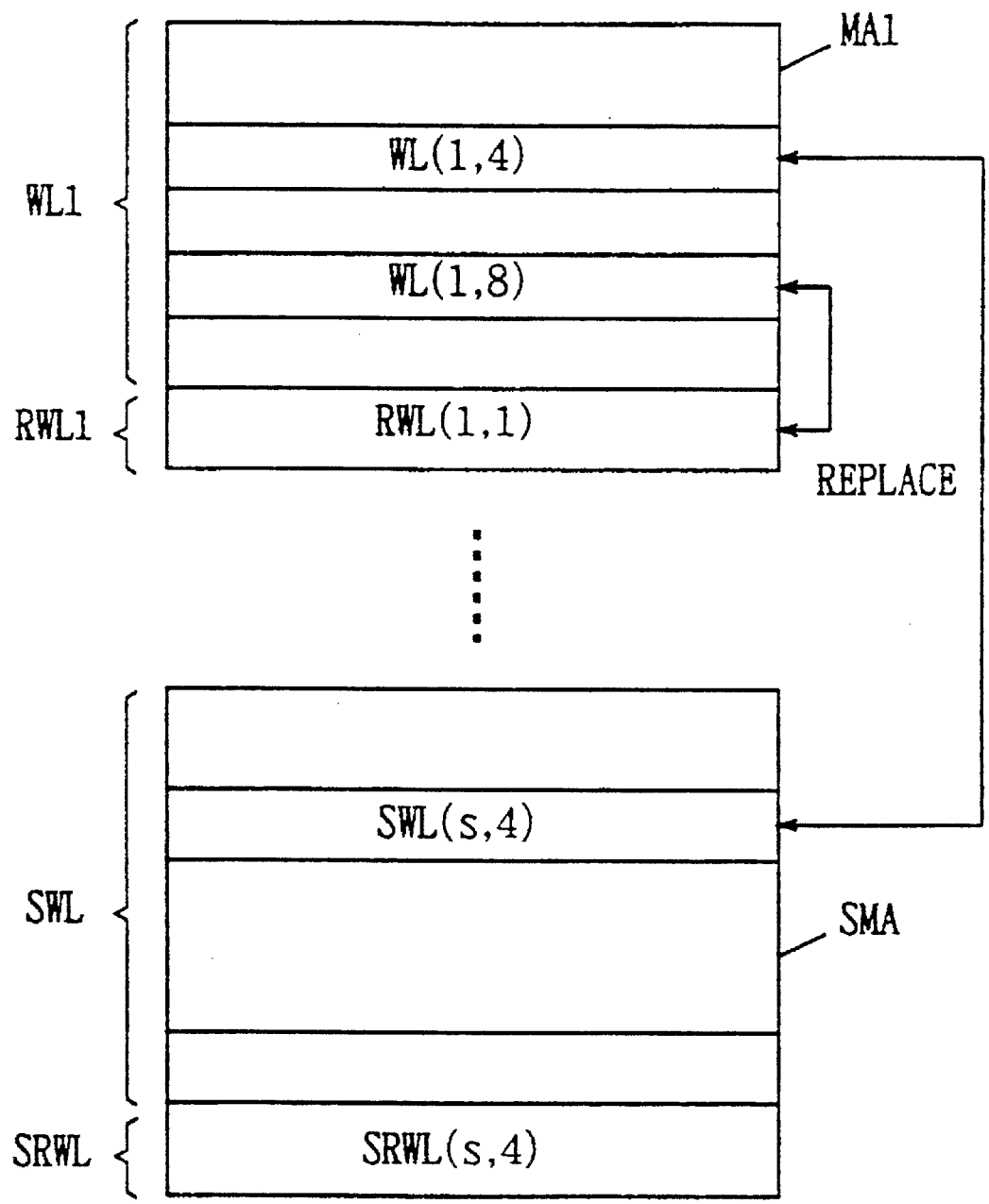
FIG. 28 shows an example of word line replacement in the arrangement of FIG. 27.

As shown in FIG. 28, if two repairable defective normal word lines WL(1, 4) and WL(1, 8) are found in the memory array MA1, these are repaired as follows. The word line WL(1, 4) is replaced with a spare word line SWL(s, 4) in the spare memory array SMA, and the word line WL(1, 8) is replaced with a redundant word line RWL(1, 1). If the spare word line SWL(s, 4) is found defective through checking after the replacement, the spare word line SWL(s, 4) is replaced with the spare redundant word line SRWL(s, 1). The replacement of spare word lines will be described later in detail.

In the replacement procedure described above, if another memory array MAm (m≈1) includes a repairable defective normal word line WL(m, 4), and no other memory array does not require the spare word line SWL(s, 8), the word line WL(1, 4) is replaced with the redundant word line RWL(1, 1) and the word line WL(1, 8) is replaced with the spare word line SWL(s, 4).

Figure 29:
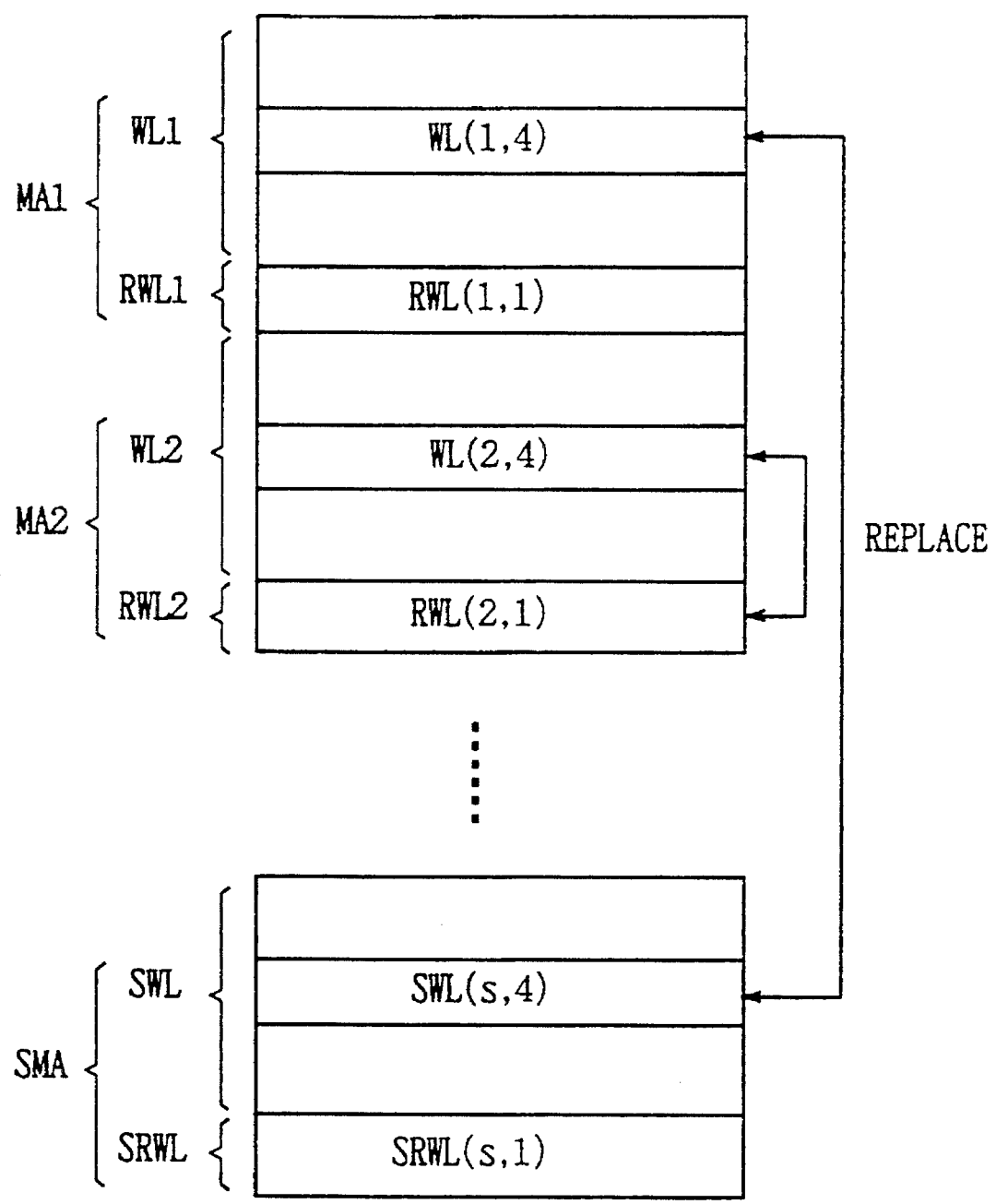
FIG. 29 shows another example of word line replacement in the arrangement of FIG. 27.

Now, consider the case where the memory array MA1 includes a repairable defective normal word line WL(1, 4) and the memory array MA2 includes a repairable defective normal word line WL(2, 4), as shown in FIG. 29. In this case, the word line WL(14) is replaced with a spare word line SWL(s, 4) in the spare memory array SMA, and the word line WL(2, 4) is replaced with a redundant word line RWL(2, 1) in the memory array MA2. As described above, even if any two memory arrays requires a common spare word line, or even if any two memory arrays includes repairable defective normal word lines at the common row address in the arrays, such two defective word line can be repaired, and product yield is improved.

Meanwhile, if each of memory arrays MA1–MA4, includes a single repairable defective normal word line, the associated redundant word may be used for replacement and the spare memory array SMA may not be used with the switching element SW1 kept off. This scheme reduces the current consumption by the amount of current consumption required for the spare memory array SMA.

If a normal memory array includes a non-repairable defective normal word line, such normal memory array is replaced with the spare memory array SMA.

Figure 30:
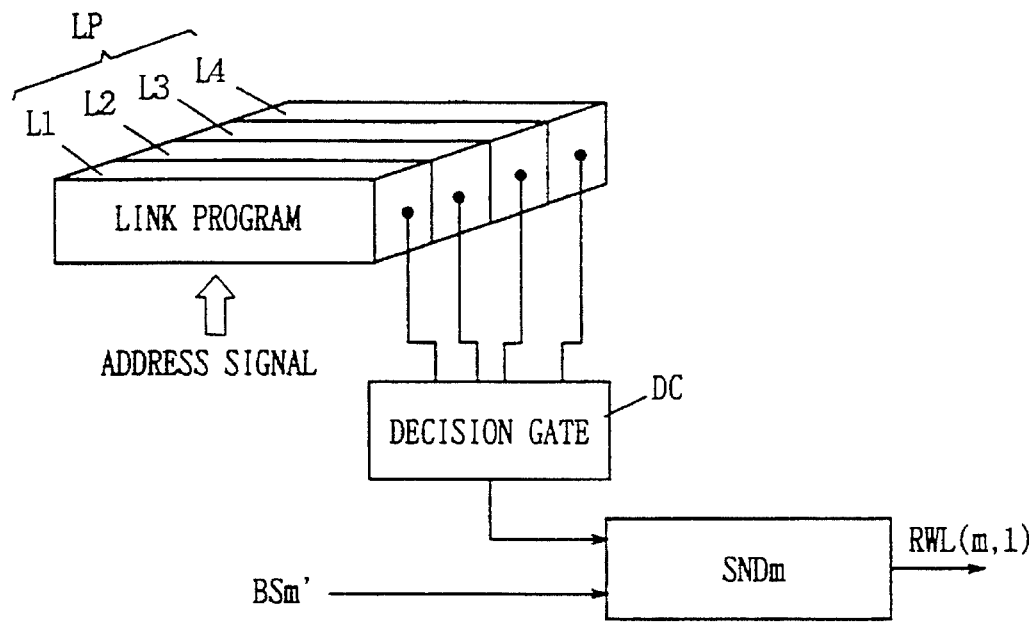
FIG. 30 shows a defective row address program circuit for a redundant decoder shown in FIG. 27.

FIG. 30 shows an arrangement for implementing the line replacement in each of memory array MA1–MA4. Referring to FIG. 30, defective address program circuit LP includes your link program circuit L1–L4 provided corresponding to memory arrays MA1–MA4. Link program circuits L1–L4 each have the same configuration as shown in FIG. 35.

Each of link program circuits L1–L4 stores a defective row address data indicating a defective normal word line to be replaced with a redundant word line (RWL(1, 1)–RWL(4, 1)) in a corresponding memory array (MA1–MA4) and compares, received (predecoded) row address signals with the defective row address data stored therein and supplies a signal indicating whether a corresponding defective normal word line is addressed.

Figure 35:
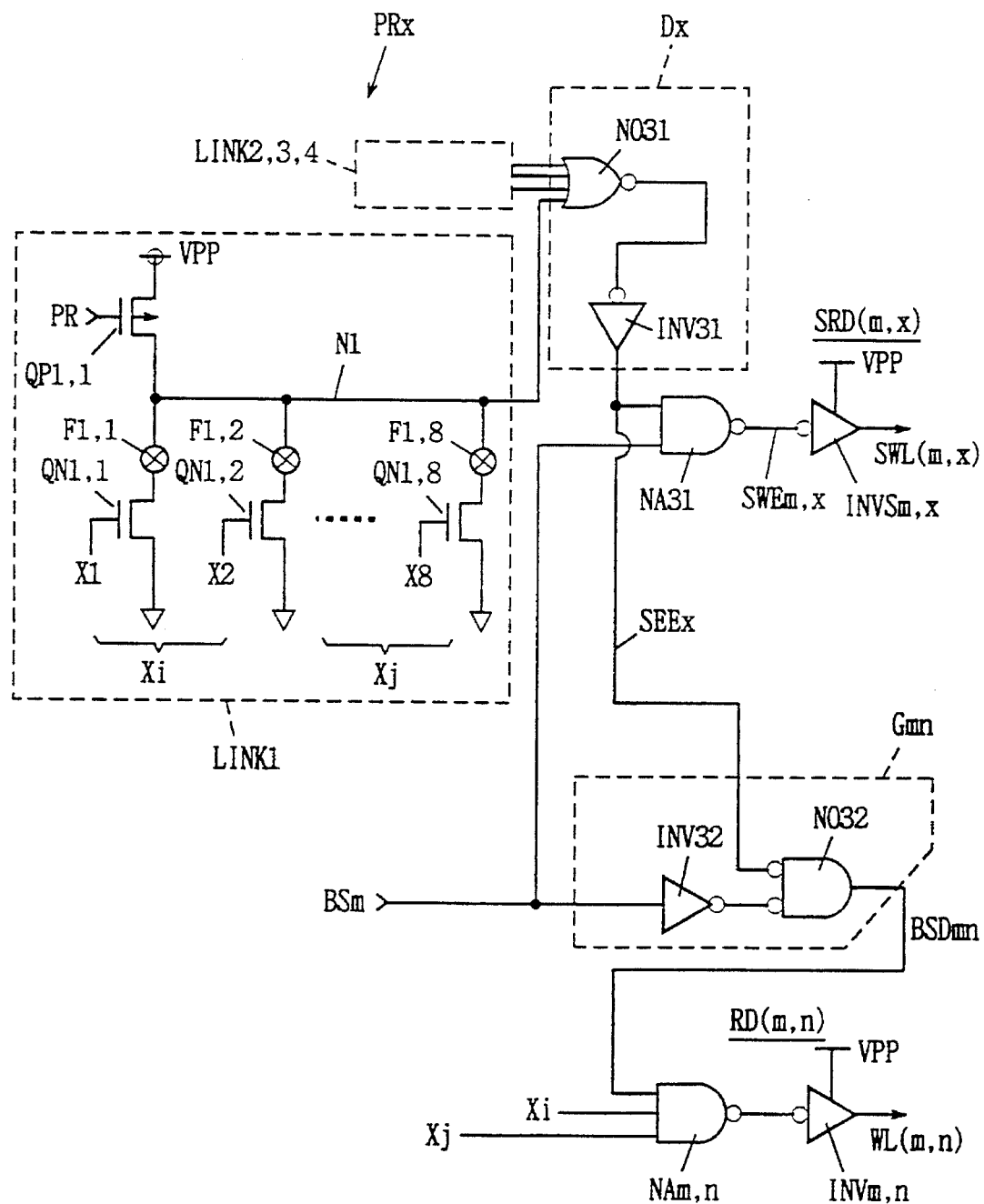
FIG. 35 shows a specific arrangement of a word line repairing control circuit in a conventional semiconductor memory device.
Figure 36:
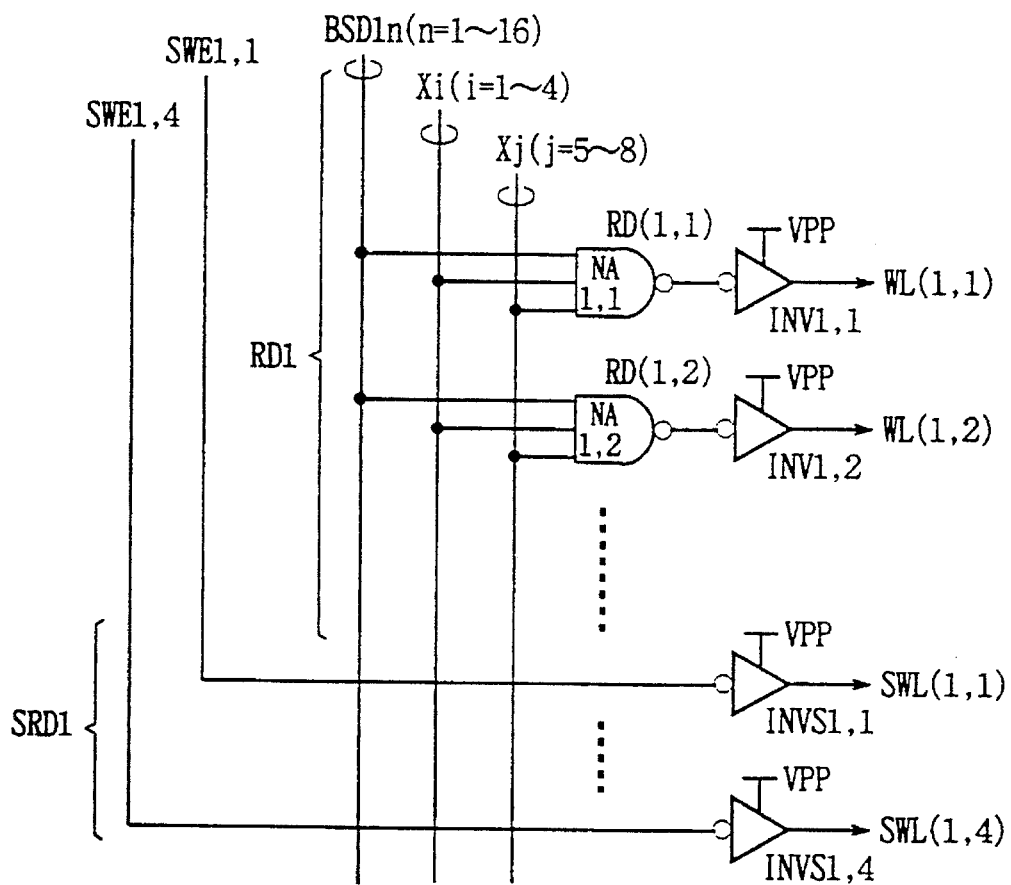
FIG. 36 shows an arrangement of row decoders and spare row decoders in a conventional semiconductor memory device.
Figure 37:
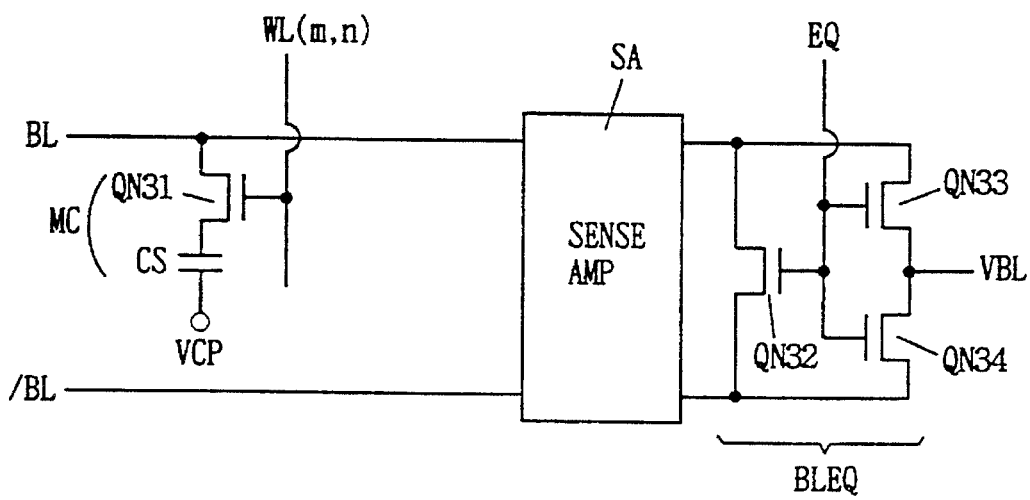
FIG. 37 shows an internal structure of a memory cell array.
Figure 38:
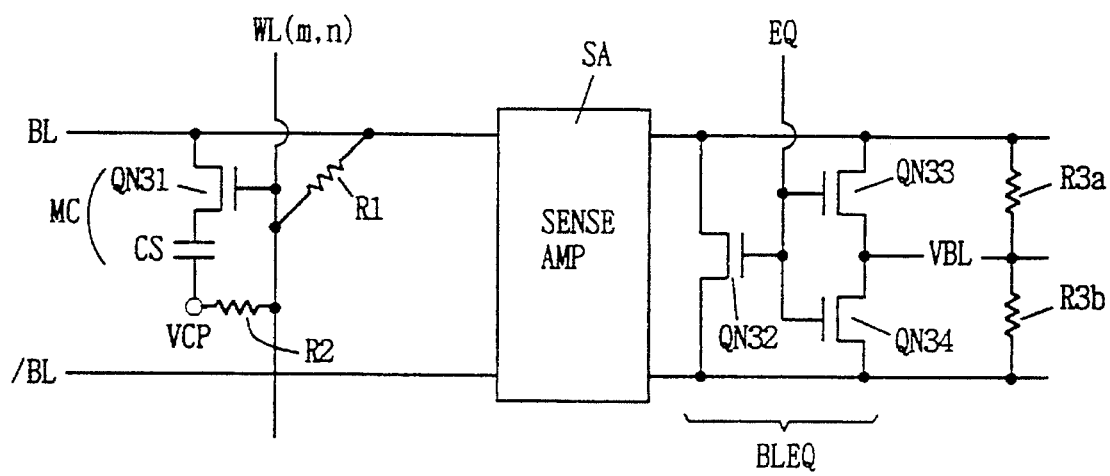
FIG. 38 illustrates defects which cannot be repaired by a word line replacement in a conventional semiconductor memory device.
Figure 39:
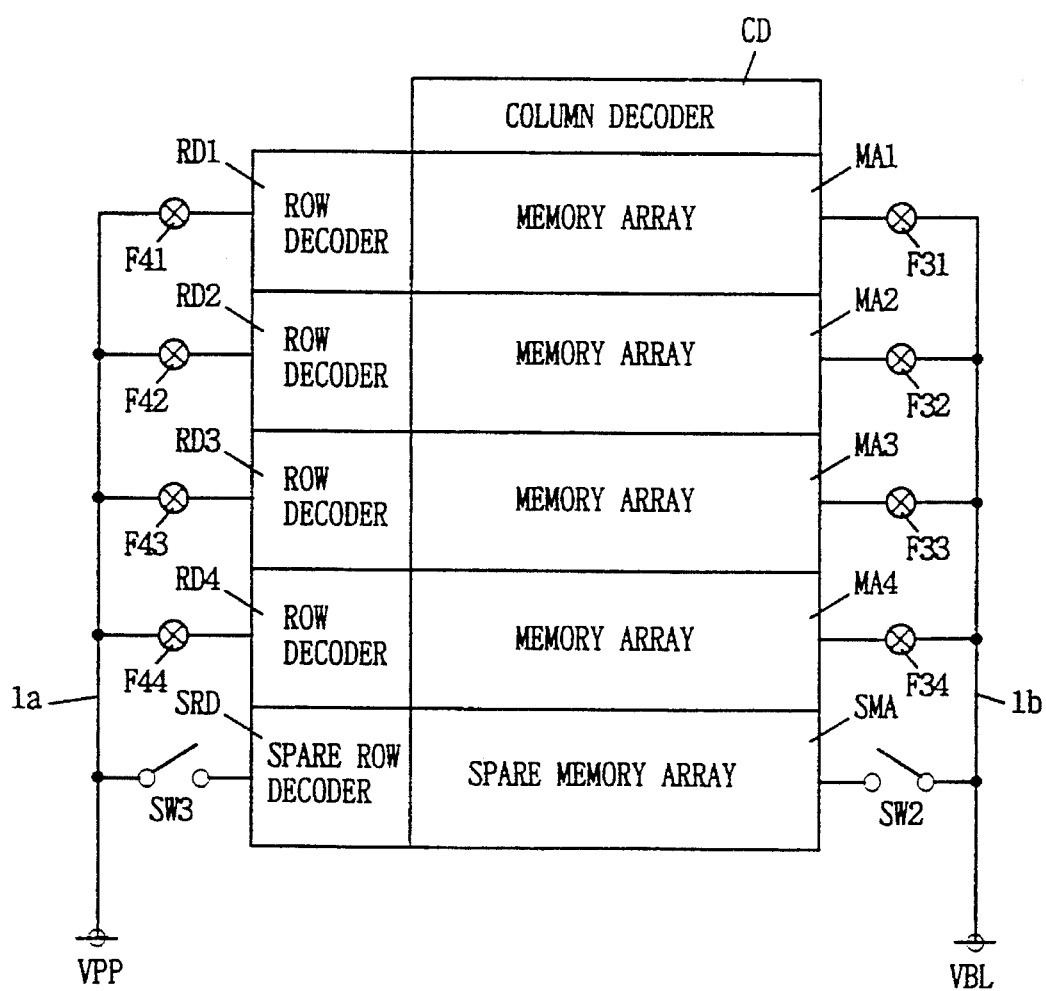
FIG. 39 shows an overall arrangement of a conventional semiconductor memory device with array (block) replacement scheme.

A decision gate DC corresponds to NOR gate NO31 and inverter INV31 shown in FIG. 35. Decision gate generates an active (H level) signal when the defective address program circuit LP indicates that a defective normal word line is addressed.

A redundant decoder SNDm receives an output of decision gate DC and the array designating signal BSm' and drives a corresponding redundant word line RWL(m, 1) to a selected state (VPP level) when both the output of decision gate DC and the block designating signal BSm' are active.

Figure 31:
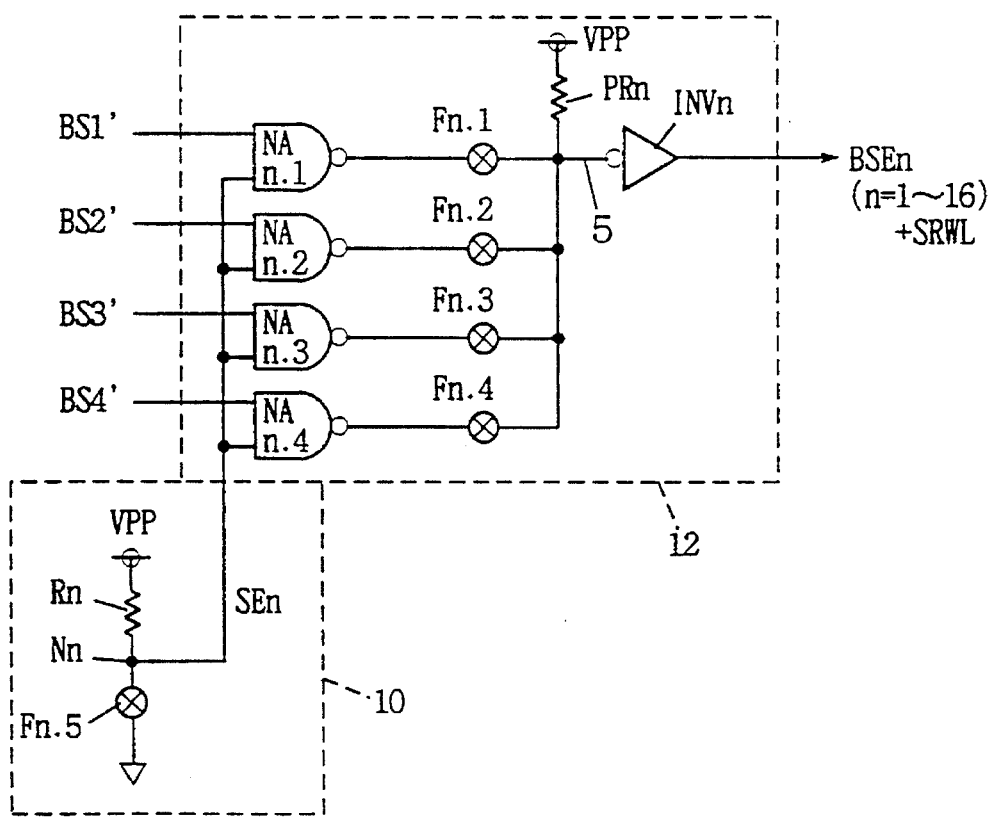
FIG. 31 shows a defective row address program circuit for a spare memory array shown in FIG. 27.

FIG. 31 shows an arrangement for implementing replacement with a spare word line or a spare redundant word line. The arrangement of FIG. 31 corresponds to the arrangement of FIG. 2. In the arrangement of FIG. 31, a pull-up resistance PRn having a large resistance value is provided between the node supplying the high voltage VPP and the signal line 5. The other configuration of FIG. 31 is the same as that of FIG. 2, and like components are denoted with like reference characters. The arrangement of FIG. 31 is provided for each of spare word lines SWL(s, 1)–SWL(s, 16) and spare redundant word line SRWL(s, 1).

Programming of the program circuits 10 and 12 are the same as that of FIG. 2 arrangement.

When a spare word line SWL(s, n) is found defective, fuse elements Fn.1, Fn.2, Fn.3 and Fn.4 are all cut off, or blown off. The signal line 5 is isolated from NAND gates NAn.1–NAn.4 and has the potential pulled up to the high voltage VPP through the pull up resistance RPn. The signal BSEn is fixed to L level by the inverter INVn.

Program circuit 10 and 12 provided for the spare redundant word line SRWL(s, 1) is programmed so as to pass the array block designating signal designating a memory array using the defective spare word line. Row address of the defective spare word line is programmed in a separate link circuit L5 as shown in FIG. 32 which will be described later.

The replacement of the defective spare word line is effected.

Figure 32:
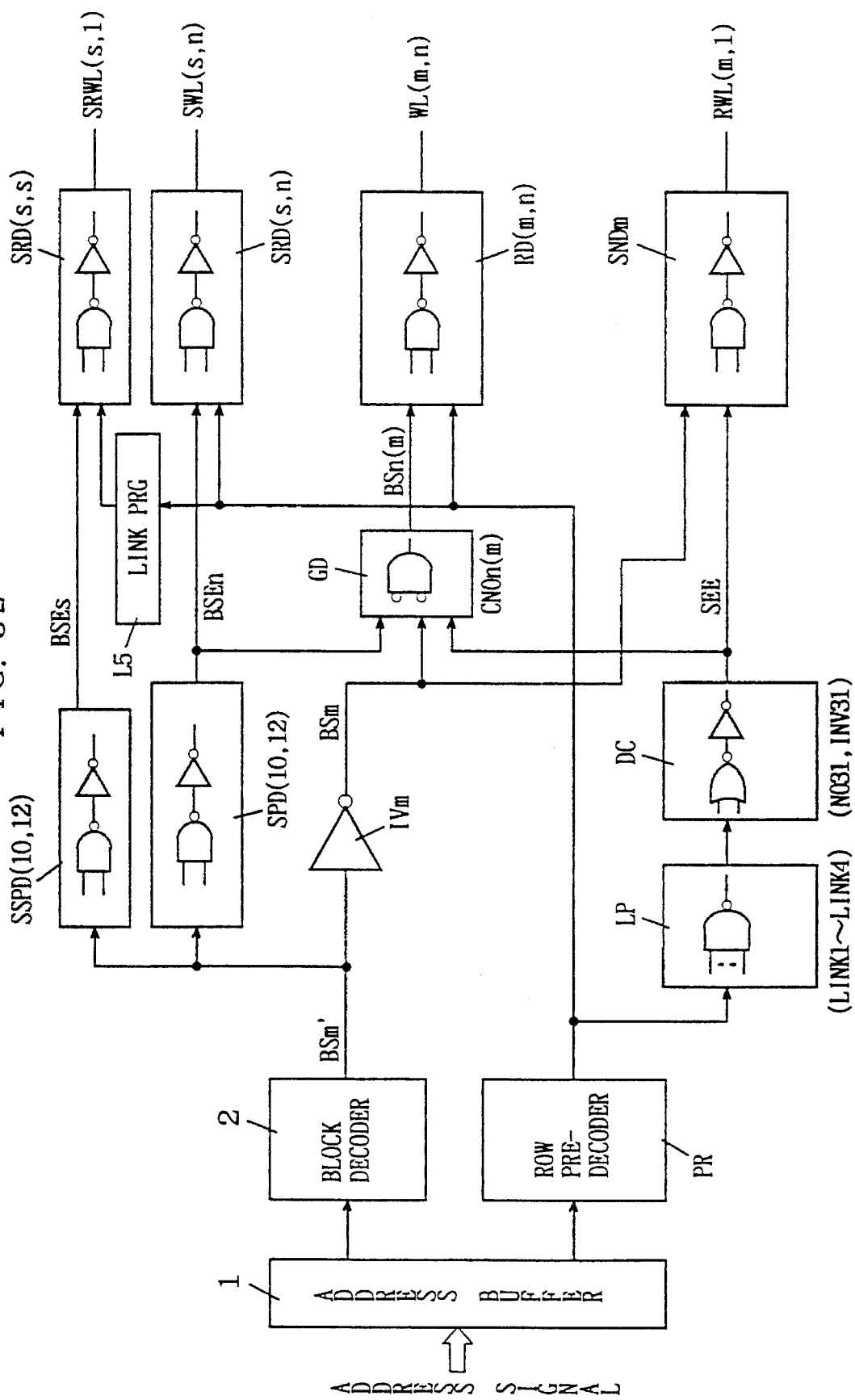
FIG. 32 shows an arrangement of row selection circuitry for the arrangement of FIG. 27.
Figure 33:
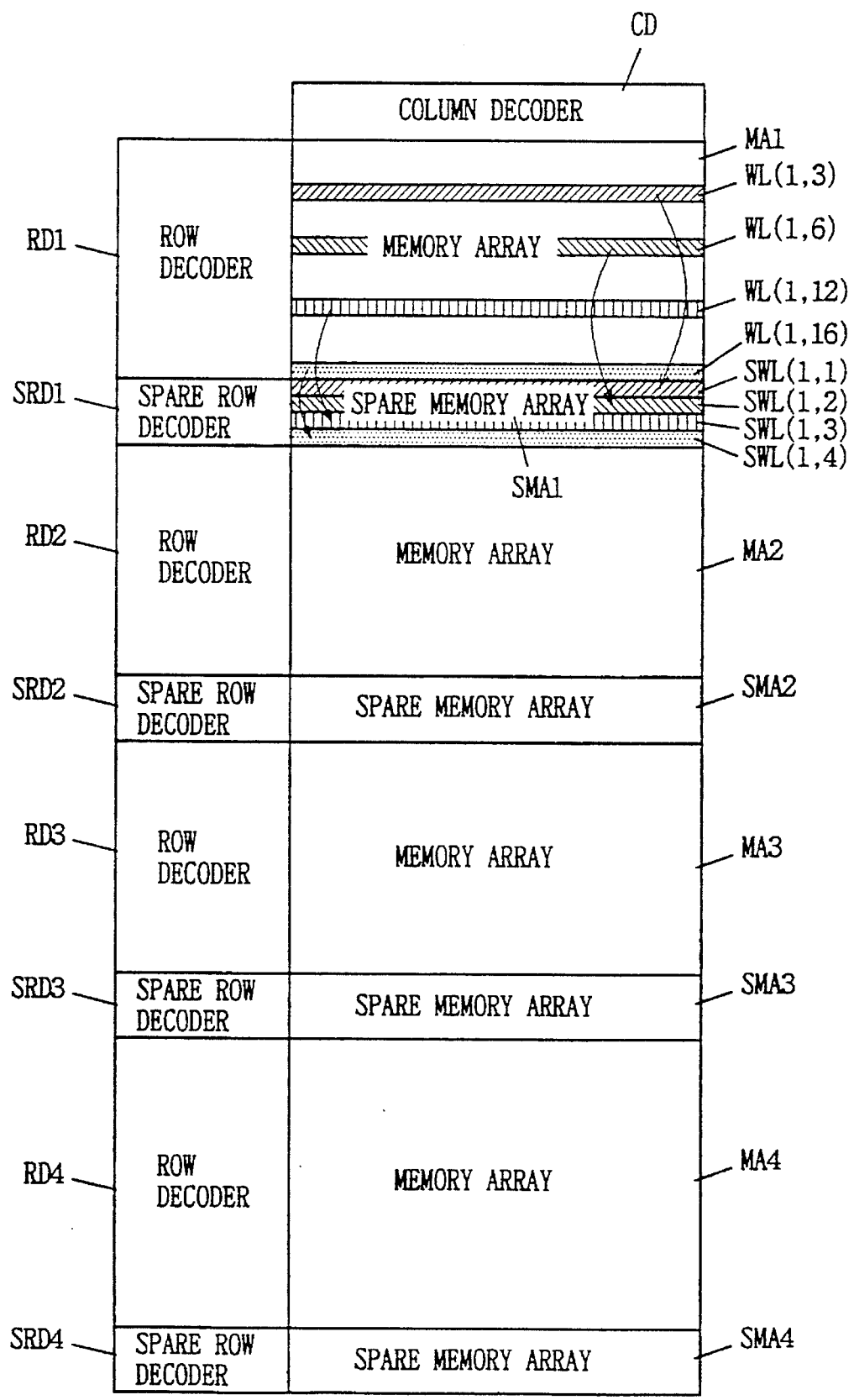
FIG. 33 shows an overall arrangement of a conventional semiconductor memory device.
Figure 34:
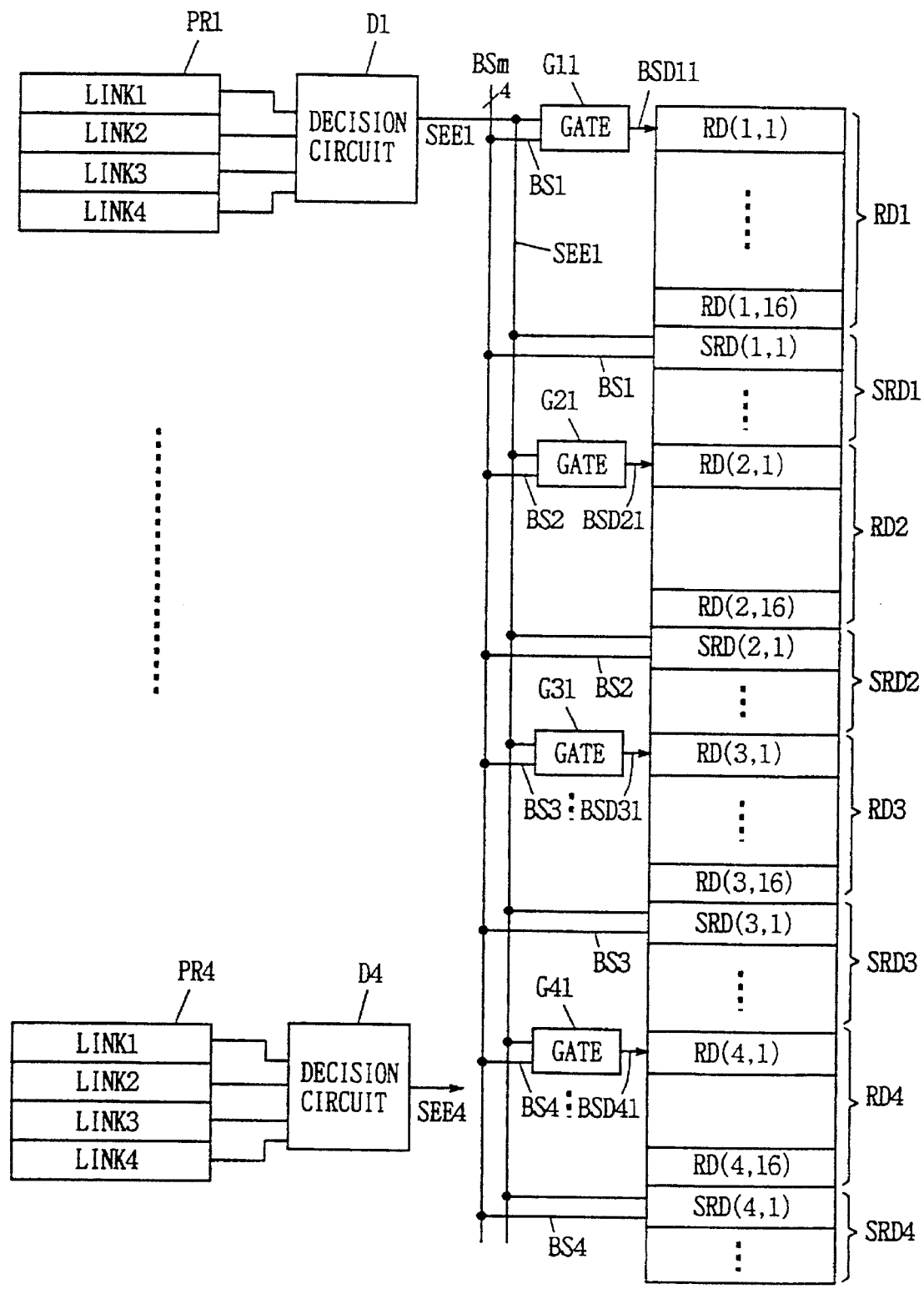
FIG. 34 shows an arrangement of a conventional word line repairing scheme.

FIG. 32 shows a schematic overall arrangement for row selection circuitry. In FIG. 32, arrangements for a normal word line WL(m, n), a redundant normal word line RWL(m, 1), a spare word line SWL(s, n) and a spare redundant word line SRWL(s, 1) are representatively shown.

Address buffer 1 receives an external address signal to generate an internal address signal including a block address signal and a row address signal. Block decoder 2 decodes the block address signal received from the address buffer 1 to generate a block designating signal BSm'.

Row predecoder RPD predecodes the row address signal to generate row predecoded signals Xi and Xj as shown in FIGS. 5 and 6.

Defective row address program circuit LP includes four link program circuit LINK1–LINK4 as shown in FIG. 30 and compares the stored defective row address data with the row predecoded signals received from the row predecoder RPD, and generates a signal indicating the result of comparison.

Decision gate DC includes NOR gate and inverter as shown in FIG. 35 and generates a redundant decoder enable signal SEE in accordance with the output of defective row address program circuit LP.

A spare program circuit SPD is provided for spare word line SWL(s, n) and includes NAND gate and inverter as shown in FIG. 31 and generates a spare decoder enable signal BSEn when the block designating signal BSm' indicates the memory array using the spare word line SWL(s, n).

A redundant program circuit SSRD is provided for the spare redundant word line SRWL(s, 1) and has the same configuration as that of spare program circuit SPD and generates a spare redundant decoder enable signal BSEs when the block designating signal BSm' designates a memory array using the spare redundant word line SRWL(s, 1).

Inverter IVm inverts the block designating signal BSm' as shown in FIG. 3.

A gate GD corresponds to the gate NOn(m) shown in FIG. 3 and receives the signals BSm, BSEn, BSEs and SEE. The gate GD generates an active word line enable signal BSn(m) when the signals BSEn, BSEs and SEE are both inactive and the signal BSm is active.

A link program circuit L5 has the same configuration as that of link program circuit LINK1–LINK4 as shown in FIG. 35 and stores a defective spare word line address and compares the predecoded signals from row predecoder RPD with the stored defective spare word line address data and generates a signal indicating the result of comparison. Due to provision of link program circuit L5, a defective spare word line can be replaced with a spare redundant word line.

A redundant decoder SNDm includes NAND gate and an inverter as shown in FIG. 35 and receives the signals BSm and SEE and drives the redundant word line RWL(m, 1) to a selected state when both the received signals BSm and SEE are active.

A row decoder RD(m, n) has the same configuration as that of row decoder shown in FIG. 5, and drives the word line WL(m, n) to a selected state when the predecoded signals from row predecoder RPD designate the row address of the word line WL(m, n) and the signal BSn(m) is active.

A spare row decoder SRD(s, n) has the configuration as shown in FIG. 6, and drives the spare word line SWL(s, n) to a selected state when the predecoded signals from row predecoder RPD designate the row address of the spare word line SWL(s, n) and the signal BSEn is active.

A spare redundant row decoder SRD(s, s) has the same configuration as that of redundant row decoder SNDm and drives the spare redundant word line to a selected state when an output of link program circuit L5 is active and the signal BSEs is active.

Now, operation of the arrangement of FIG. 32 is briefly described with reference to FIGS. 28 and 29. In the replacement of FIG. 32, when the word line WL(1, 4) is designated, the signal BSEn is activated through the program circuit SPD, and responsively the gate GD is disabled so that no normal word line WL(m, 4) is selected. Spare row decoder SRD(s, 4) is enabled by the signal BSEn(n=4) and the spare word line SWL(s, 4) is selected in accordance with the row predecoded signals from predecoder RPD.

In this case the signal SEE is made active by the circuits LP and DC because the circuit LP stores the row address "2" for the word line WL(2, 4). However, the block designating signal BS2 is inactive and the redundant word line RWL(2, 1) is not selected.

When the word line WL(2, 4) is addressed (refer to FIG. 28), the signal BSE4 is inactive because the memory array MA2 is designated, and the spare word line SWL(s, 4) is not selected.

On the other hand, the signal SEE is activated, and the block designating signal BS2 designating memory array MA2 is activated, so that the redundant word line RWL(2, 1) is selected by the redundant row decoder SND2.

In the replacement of the spare word line SWL(s, n) with the spare redundant word line SRWL(s, 1), when the spare word line SWL(s, n) is designated, the signal BSEn is inactive and the signal BSEs is active. Thus, the decoder SRD(s, s) activates the word line SRWL(s, s) in response to the output of link program circuit L5.

A plurality of redundant word lines can be provided for each memory array by simple extension of the arrangement of FIG. 32.

A shift redundancy arrangement may be employed without using the link program circuit LINK1–LINK4 (L1–L4) and L5.

The arrangement of FIG. 27 can be applied to any other embodiment described previously.

According to the present invention, a spare array and a memory array includes the same number of word lines, and a word line-by-word line replacement as well as an array-by-array replacement can be provided.

In addition, a word line in a memory array is replaced by a spare word line at the same address or location in the spare array, resulting in facilitated replacement of a defective word line and simplified configuration of replacement control. Icc2 test on an array basis can be also implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory arrays each having
      (i) a plurality of memory cells arranged in rows and columns and
      (ii) a plurality of word lines arranged corresponding to the rows and connecting memory cells on corresponding rows;
   at least one spare memory array having
      (i) memory cells arranged in rows and columns and
      (ii) a plurality of spare word lines arranged corresponding to the rows and connecting memory cells on corresponding rows, the number of the spare word lines being equal to that of the word lines in each of said memory arrays, each of said word lines in each respective memory array uniquely corresponding to each of said plurality of spare word lines in said spare memory array when no defective word line is present; and
   replacement control circuitry for, when a defective word line is found present in a memory array among said plurality of memory arrays, replacing the defective word line with a corresponding spare word line while keeping the defective word line in a disabled state, and said replacement control circuitry including means for replacing the defective memory array with one of said at least one spare memory array when a defective memory array is found present in said plurality of memory array.

2. A semiconductor memory device according to claim 1, wherein each of said plurality of memory arrays further includes at least one redundant word line each connecting a row of memory cells, and said spare array further includes at least one spare redundant word line each connecting a row of memory cells, and said replacement control circuitry includes a redundant replacement circuit for, when a defective word line is present in a certain array, replacing the defective word line with a redundant word line in said certain array.

3. A semiconductor memory device according to claim 1, wherein said replacement control circuitry includes,
   a plurality of spare row decoders provided corresponding to respective spare word lines for decoding an applied row address signal and generating spare word drive signals onto corresponding spare word lines according to the result of decoding, and
   a plurality of row decoders provided for the plurality of word lines in the respective memory arrays for decoding the applied row address signal to generate word line drive signals onto corresponding word lines, each of said plurality of row decoders having the same logic configuration as that of each of said plurality of spare row decoders.

4. A semiconductor memory device according to claim 1, wherein said replacement control circuitry includes, a plurality of spare row decoders provided corresponding to respective spare word lines for decoding an applied row address signal and generating spare word drive signals onto corresponding spare word lines according to the result of decoding, a plurality of row decoders provided for the plurality of word lines in the respective memory arrays for decoding an applied row address signal to generate word line drive signals onto corresponding word lines, program control circuits provided corresponding to the respective spare row decoders for storing array addresses using corresponding spare word lines and for enabling corresponding spare row decoders when an applied array address signal designating a memory array designates a memory array using corresponding spare word lines, gate circuits provided corresponding to the respective row decoders and to said program control circuits for disabling corresponding row decoders when corresponding program circuits enable corresponding spare row decoders.

5. A semiconductor memory device according to claim 4, wherein each of said program control circuits comprises, a first program circuit for generating a spare enabling signal indicating that a corresponding spare word line is used for replacing a defective word line, and a second program circuit enabled by said spare enabling signal for transferring an array designating signal designating a memory array using a corresponding spare word line to a corresponding spare row decoder.

6. A semiconductor memory device according to claim 5, wherein said second program circuit comprises, a plurality of logic gates provided corresponding to a plurality of array designating signals designating different memory arrays of said plurality of memory arrays, for transferring corresponding array designating signals when enabled by said spare enabling signal, and a plurality of fusible link elements provided at outputs of said plurality of logic gates, output signals of said logic gates being transferred onto a common signal line through corresponding fusible link elements, a signal on said common line corresponding to said spare enabling signal.

7. A semiconductor memory device according to claim 4, wherein each of said gate circuits comprises a logic gate receiving a corresponding spare enabling signal and a corresponding array designating signal to supply the corresponding array designating signal to a corresponding row decoder when enabled by said spare enabling signal.

8. A semiconductor memory device according to claim 4, wherein each of said row decoders comprises a first gate of a predetermined arrangement for receiving the row address signal and an output of a corresponding gate circuit among said gate circuits to generate the word line drive signal, and each of said spare row decoders comprises a logic gate of said predetermined arrangement for receiving an output of a corresponding program control circuit of said program control circuits and the row address signal to generate the spare word line drive signal.

9. A semiconductor memory device according to claim 1, wherein each of said plurality of word lines in each of said plurality of memory arrays and a corresponding spare word line in said spare memory array are allotted with a common row address with each other.

10. A semiconductor memory device according to claim 1, further comprising, a source line supplying a predetermined internal voltage, voltage supply control means for isolating a defective memory array if any among said plurality of memory arrays from said source line and connecting said source line to said spare memory array.

11. A semiconductor memory device according to claim 10, further including, means responsive to a test mode designating signal for generating a spare array designating signal, means responsive to said test mode designating signal and said spare array designating signal and an applied row address signal for transferring a spare word line drive signal onto a spare word line designated by said row address signal.

12. A semiconductor memory device, according to claim 10, wherein said plurality of memory arrays and said at least spare array constitute a memory block, wherein said semiconductor memory device includes a multiplicity of said memory blocks, and said replacement control circuitry is provided corresponding to each respective memory block.

13. A semiconductor memory device according to claim 1, further comprising, a source line supplying a predetermined internal voltage to each of said memory arrays, and a voltage control element for supplying said predetermined internal voltage to each said arrays when only a repairable defective word line is found present in any of said plurality of memory arrays.

14. A semiconductor memory device according to claim 1, further including a source line supplying a predetermined internal voltage, a plurality of fusible link elements provided corresponding to each respective memory array for supplying said predetermined internal voltage to corresponding memory arrays when conductive, a switching element provided for said spare memory array for supplying said predetermined internal voltage when conductive, and voltage control circuit for controlling conduction and non-conduction of said switching element.

15. A semiconductor memory device according to claim 1, further comprising, a source line transferring predetermined internal voltage, standby means for generating a standby current test mode designating signal, address determination circuitry responsive to said standby current test mode designating signal for generating an array designating signal while inhibiting generation of a row address signal, and connection control circuitry responsive to said standby current test mode designating signal and said array designating signal for connecting the source line to an array designated by said array designating signal.

16. A semiconductor memory device according to claim 15, wherein said address determination circuitry includes, row selection circuitry for generating a row designating signal in accordance with an applied row address signal designating a row in each of said memory arrays, array selection circuitry for generating the array designating signal in accordance with an applied array address signal, and selection control circuitry responsive to activation of said standby current test mode designating signal for enabling said array selection circuitry and disabling said row selection circuitry.

17. A semiconductor memory device according to claim 15, wherein said address determination circuitry comprises, a first buffer responsive to an external memory cycle starting signal for generating a first memory cycle starting signal, a second buffer responsive to said external memory cycle starting signal and said standby current test mode designating signal for generating a second memory cycle designating signal, said second memory cycle designating signal kept inactive when said standby current test mode designating signal is activated, row designating signal generator responsive to an external row address signal for generating a row designating signal designating a row in each of said plurality of memory arrays when said second memory cycle starting signal is active, and array designating signal generator responsive to an external array address designating a memory array among said plurality memory arrays for generating an array designating signal when said first memory cycle starting signal is active.

18. A semiconductor memory device according to claim 17, wherein said row designating signal generator includes a row address buffer for receiving said external row address signal to generate an internal row address signal when said second memory cycle starting signal is active, and said array designating signal generator includes an array address buffer for receiving the external array address signal to generate an internal array address signal when said first memory cycle starting signal is active.

19. A semiconductor memory device according to claim 15, wherein said standby means includes, a test mode means responsive to an applied test mode designating signal for generating an internal test mode designating signal, and means responsive to an applied standby test designating signal for generating said standby current test designating signal when said internal test mode designating signal is active.

20. A semiconductor memory device according to claim 15, further including another source line transferring another predetermined internal voltage, and wherein said connection control circuitry further includes means for supplying to said predetermined internal voltage and said other predetermined internal voltage to the array designated by said array designating signal.

21. A semiconductor memory device according to claim 15, further including, another source line transferring another predetermined internal voltage, and wherein said connection control circuitry includes means responsive to a voltage designating signal designating one of said predetermined voltage and said other predetermined voltage for connecting one of said source line and said other source line to the array designated by said array designating signal.

22. A semiconductor memory device according to claim 15, wherein said address determination means includes spare array designation means for generating a spare array designating signal as said array designating signal.

23. A semiconductor memory device according to claim 15, further including, means for generating a spare array designating signal designating said spare array, and means responsive to said standby current test mode designating signal and said spare array designating signal for supplying said predetermined internal voltage to said spare array designated by said spare array designating signal while isolating other arrays from said source lines.

24. A semiconductor memory device according to claim 1, wherein said at least one spare array includes a multiplicity of spare arrays.

25. A method of testing a semiconductor memory device including a plurality of memory arrays each having a plurality of memory cells arranged in rows and columns, at least one spare memory array having the same number of rows and columns of memory cells as each of said plurality of memory arrays, and a source line transferring a predetermined internal voltage, comprising the steps of:

performing a standby current test on a memory array designated by an array designating signal while connecting said memory array to said source line and isolating other arrays from said source lines, when the memory array is found defective due to larger standby current than a predetermined value, replacing said memory array with said spare memory array, performing the standby current test on the spare array while connecting only said spare array to said source line, when the standby current test is performed for all the plurality of memory arrays, performing a function test to determine whether a defective row is present in any of said plurality of memory arrays, and replacing the defective row with a row in said spare array if the defective row can be replaced with the row in said spare array.

26. A method of testing a semiconductor memory device according to claim 25, wherein said step of replacing the defective row includes the step of replacing the defective row with a row at the same row address location as the defective row in said spare array.

27. A method according to claim 25, wherein each of said memory arrays includes one or more redundant rows and wherein said step of replacing the defective row includes the step of replacing the defective row with a redundant row in the memory array including the defective row.

28. A method of testing a semiconductor memory device according to claim 25, further including the step of performing the standby current test on the spare array even if no defective memory array is found present in the standby current test.

29. A method according to claim 25, wherein said step of performing the standby current test on a memory array includes the step of performing a decode operation on an array address signal designating a memory array to generate said array designating signal while inhibiting a decode operation on a row address signal designating a row in each of said plurality of memory arrays in response to a standby current test mode designating signal.

30. A semiconductor memory device, comprising:

a plurality of memory arrays each having
(i) a plurality of memory cells arranged in rows and columns and
(ii) a plurality of word lines arranged corresponding to the rows and connecting memory cells on corresponding rows;

at least one spare array having (i) memory cells arranged in rows and columns and (ii) a plurality of spare word lines arranged corresponding to the rows and connecting memory cells on corresponding rows, the number of the spare word lines being equal to that of the word lines in each of said memory arrays, a plurality of redundant arrays provided corresponding to the respective memory arrays and to said at least one spare array, and each including one or more redundant word lines each connecting a row of memory cells, first replacement control circuitry for, when a defective word line is found present in a memory array among said plurality of memory arrays, replacing the defective word line with a corresponding spare word line, and second replacement control circuitry for, when a defective word line is found present in a certain memory array among said plurality of memory arrays and said at least one spare memory array, replacing the defective word line with a redundant word line in a corresponding redundant array among said plurality of redundant arrays.

31. A semiconductor memory device, comprising:

a plurality of memory arrays each having
(i) a plurality of memory cells arranged in rows and columns and
(ii) a plurality of word lines arranged corresponding to the rows and connecting memory cells on corresponding rows;

at least one spare array having
(i) memory cells arranged in rows and columns and
(ii) a plurality of spare word lines arranged corresponding to the rows and connecting memory cells on corresponding rows; and replacement control circuitry for, when a defective word line is found present in a memory array among said plurality of memory arrays, replacing the defective word line with a corresponding spare word line, and including (a) a plurality of row decoders provided corresponding to said plurality of word lines and decoding an applied address signal for driving corresponding word lines to a selected state according to the result of decoding, and (b) a plurality of spare decoders provided corresponding to said plurality of spare word lines and decoding the applied address signal to drive corresponding spare word lines to the selected state according to the result of decoding, each of said plurality of row decoders having a common logic gate configuration with each of said plurality of spare row decoders.

32. A semiconductor memory device, comprising:

(a) a plurality of memory arrays, each memory array having
(i) a plurality of memory cells in rows and columns, and
(ii) a plurality of word lines arranged corresponding to the rows and connected to corresponding rows of memory cells;

(b) at least one spare memory array having
(i) a plurality of spare memory cells arranged in rows and columns, and
(ii) a plurality of spare word lines arranged corresponding to the rows and connected to corresponding rows of spare memory cells;

(c) a source line supplying a predetermined internal voltage;

(d) word line replacement means for replacing a defective word line of said plurality of memory arrays with one of said plurality of spare word lines; and (e) control means for isolating a defective memory array if any among said plurality of memory arrays from said source line and connecting said source line to said spare memory array, wherein said defective memory array is kept isolated regardless of whether the defective memory array is addressed.

33. The semiconductor memory device of claim 32, wherein said word line replacement means includes a voltage control element for supplying said predetermined internal voltage to each of said plurality of memory arrays when the defective memory word line is repairable with one of said plurality of spare word lines.

34. The semiconductor memory device of claim 32, wherein said control means includes:

a plurality of fusible link elements provided corresponding to each respective memory array, said fusible link element being non-conductive to isolate the respective memory array found to be defective, a switch element to supply the predetermined internal voltage to said spare memory array, and a voltage control circuit to control conduction and non-conduction of said switch element.

35. The semiconductor memory device of claim 32, further comprising:

standby means for generating a standby current test mode designating signal;

address determination circuitry responsive to said standby current test mode designating signal for generating an array designating signal while inhibiting generation of a row address signal; and connection control circuitry responsive to said standby current test mode designating signal and said array designating signal for connecting the source line to an array designated by said array designating signal.

36. The semiconductor memory device of claim 32, further comprising:

means responsive to a test mode designating signal for generating a spare array designating signal; and means responsive to said test mode designating signal and said spare array designating signal and an applied row address signal for transferring a spare word line drive signal onto a spare word line designated by said row address signal.

37. The semiconductor memory device of claim 32, wherein a number of spare word lines is at least equal to a number of word lines in each of said memory array and each of said plurality of word lines in each respective memory array uniquely corresponds to each of said plurality of spare word lines in said spare memory array when no defective word line is present.

38. The semiconductor memory device of claim 32, wherein the defective word line of a row among said plurality of memory arrays is replaced with the spare word line at a row address location having a predetermined relationship with the row address location the defective word line.

39. A method of testing a semiconductor memory device including a predetermined number of memory arrays, each array having memory cells arranged in rows and columns, at least one spare memory array having spare memory cells arranged in rows and columns, and a source line to provide a predetermined internal voltage, the method comprising the steps of:

a) standby current testing a memory array designated by an array designating signal while connecting the memory array to the source line and isolating other memory arrays from the source line;

b) standby current testing the spare memory array while connecting only the spare memory array to the source line;

c) function testing the predetermined number of memory arrays to determine a defective row in any of the memory arrays;

d) replacing the defective row with a row in the spare array if the defective row can be replaced with the row in the spare memory array; and e) determining whether the defective row has been correctly replaced with the row in the spare memory array.

40. The method of claim 39, wherein the steps (a) and (b) are repeated based on the predetermined number of memory arrays prior to performing step (c).

41. The method of claim 39 further comprising the step of replacing a defective memory array detected during step (a) with the spare memory array prior to performing step (b).

42. A semiconductor memory device, comprising:

(a) a plurality of memory arrays each having
  (i) a plurality of memory cells arranged in rows and columns and
  (ii) a plurality of word lines arranged corresponding to the rows and connecting memory cells on corresponding rows;

(b) at least one spare memory array having
  (i) memory cells arranged in rows and columns and
  (ii) a plurality of spare word lines arranged corresponding to the rows and connecting memory cells on corresponding rows, the number of the spare word lines being equal to that of the word lines in each of said memory arrays, each of said word lines in each respective memory array uniquely corresponding to each of said plurality of spare word lines in said spare memory array when no defective word line is present; and (c) replacement control circuitry for, when a defective word line is found present in a memory array among said plurality of memory arrays, replacing the defective word line with a corresponding spare word line, wherein said replacement control circuitry includes
  (i) a plurality of spare row decoders provided corresponding to respective spare word lines for decoding an applied row address signal and generating spare word drive signals onto corresponding spare word lines according to the result of decoding,
  (ii) a plurality of row decoders provided for the plurality of word lines in the respective memory arrays for decoding an applied row address signal to generate word line drive signals onto corresponding word lines,
  (iii) program control circuits provided corresponding to the respective spare row decoders for storing array addresses using corresponding spare word lines and for enabling corresponding spare row decoders when an applied array address signal designating a memory array designates a memory array using corresponding spare word lines, each of the program circuit having (1) a first program circuit for generating a spare enabling signal indicating that a corresponding spare word line is used for replacing a defective word line, and (2) a second program circuit enabled by said spare enabling signal for transferring an array designating signal designating a memory array using a corresponding spare word line to a corresponding spare row decoder, and
  (iv) gate circuits provided corresponding to the respective row decoders and to said program control circuits for disabling corresponding row decoders when corresponding program circuits enable corresponding spare row decoders, wherein said second program circuit comprises, a plurality of logic gates provided corresponding to a plurality of array designating signals designating different memory arrays of said plurality of memory arrays, for transferring corresponding array designating signals when enabled by said spare enabling signal, and a plurality of fusible link elements provided at outputs of said plurality of logic gates, output signals of said logic gates being transferred onto a common signal line through corresponding fusible link elements, a signal on said common line corresponding to said spare enabling signal.

43. A semiconductor memory device, comprising:

(a) a plurality of memory arrays each having
  (i) a plurality of memory cells arranged in rows and columns and
  (ii) a plurality of word lines arranged corresponding to the rows and connecting memory cells on corresponding rows;

(b) at least one spare memory array having
  (i) memory cells arranged in rows and columns and
  (ii) a plurality of spare word lines arranged corresponding to the rows and connecting memory cells on corresponding rows, the number of the spare word lines being equal to that of the word lines in each of said memory arrays, each of said word lines in each respective memory array uniquely corresponding to each of said plurality of spare word lines in said spare memory array when no defective word line is present; and (c) replacement control circuitry for, when a defective word line is found present in a memory array among said plurality of memory arrays, replacing the defective word line with a corresponding spare word line, wherein said replacement control circuitry includes
  (i) a plurality of spare row decoders provided corresponding to respective spare word lines for decoding an applied row address signal and generating spare word drive signals onto corresponding spare word lines according to the result of decoding,
  (ii) a plurality of row decoders provided for the plurality of word lines in the respective memory arrays for decoding an applied row address signal to generate word line drive signals onto corresponding word lines,
  (iii) program control circuits provided corresponding to the respective spare row decoders for storing array addresses using corresponding spare word lines and for enabling corresponding spare row decoders when an applied array address signal designating a memory array designates a memory array using corresponding spare word lines, and
  (iv) gate circuits provided corresponding to the respective row decoders and to said program control circuits for disabling corresponding row decoders when corresponding program circuits enable corresponding spare row decoders, each of said logic gates having a logic gate receiving a corresponding spare enabling signal and a corresponding array designating signal to supply the corresponding array designating signal to a corresponding row decoder when enabled by said spare enabling signal.

44. A semiconductor memory device, comprising:

(a) a plurality of memory arrays each having
  (i) a plurality of memory cells arranged in rows and columns and
  (ii) a plurality of word lines arranged corresponding to the rows and connecting memory cells on corresponding rows;
(b) at least one spare memory array having
  (i) memory cells arranged in rows and columns and
  (ii) a plurality of spare word lines arranged corresponding to the rows and connecting memory cells on corresponding rows, the number of the spare word lines being equal to that of the word lines in each of said memory arrays, each of said word lines in each respective memory array uniquely corresponding to each of said plurality of spare word lines in said spare memory array when no defective word line is present; and
(c) replacement control circuitry for, when a defective word line is found present in a memory array among said plurality of memory arrays, replacing the defective word line with a corresponding spare word line, wherein said replacement control circuitry includes
  (i) a plurality of spare row decoders provided corresponding to respective spare word lines for decoding an applied row address signal and generating spare word drive signals onto corresponding spare word lines according to the result of decoding,
  (ii) a plurality of row decoders provided for the plurality of word lines in the respective memory arrays for decoding an applied row address signal to generate word line drive signals onto corresponding word lines,
  (iii) program control circuits provided corresponding to the respective spare row decoders for storing array addresses using corresponding spare word lines and for enabling corresponding spare row decoders when an applied array address signal designating a memory array designates a memory array using corresponding spare word lines, and
  (iv) gate circuits provided corresponding to the respective row decoders and to said program control circuits for disabling corresponding row decoders when corresponding program circuits enable corresponding spare row decoders, wherein
    (1) each of said row decoders comprises a first gate of a predetermined arrangement for receiving the row address signal and an output of a corresponding gate circuit among said gate circuits to generate the word line drive signal, and
    (2) each of said spare row decoders comprises a logic gate of said predetermined arrangement for receiving an output of a corresponding program control circuit of said program control circuits and the row address signal to generate the spare word line drive signal.

45. A semiconductor memory device, comprising:
(a) a plurality of memory arrays each having
  (i) a plurality of memory cells arranged in rows and columns,
  (ii) a plurality of word lines arranged corresponding to the rows and connecting memory cells on corresponding rows, and
  (iii) at least one redundant word line each connecting a row of memory cells;
(b) at least one spare memory array having
  (i) memory cells arranged in rows and columns,
  (ii) a plurality of spare word lines arranged corresponding to the rows and connecting memory cells on corresponding rows, the number of the spare word lines being equal to that of the word lines in each of said memory arrays, and
  (iii) at least one spare redundant word line each connecting a row of memory cells, each of said word lines in each respective memory array uniquely corresponding to each of said plurality of spare word lines in said spare memory array when no defective word line is present, wherein each of said plurality of word lines in each of said plurality of memory arrays and a corresponding spare word line in said spare memory array are allotted with a common row address with each other;
(c) replacement control circuitry for, when a defective word line is found present in a memory array among said plurality of memory arrays, replacing the defective word line with a corresponding spare word line, said replacement control circuitry having
  (i) a redundant replacement circuit for, when a defective word line is present in a certain array, replacing the defective word line with a redundant word line in said certain array;
  (ii) a plurality of spare row decoders provided corresponding to respective spare word lines for decoding an applied row address signal and generating spare word drive signals onto corresponding spare word lines according to the result of decoding, and
  (iii) a plurality of row decoders provided for the plurality of word lines in the respective memory arrays for decoding the applied row address signal to generate word line drive signals onto corresponding word lines, each of said plurality of row decoders having the same logic configuration as that of each of said plurality of spare row decoders;
(d) a source line supplying a predetermined internal voltage;
(e) voltage supply control means for isolating a defective memory array if any among said plurality of memory arrays from said source line and connecting said source line to said spare memory array;
(f) a voltage control element for supplying said predetermined internal voltage to each said arrays when only a repairable defective word line is found present in any of said plurality of memory arrays;
(g) a plurality of fusible link elements provided corresponding to each respective memory array for supplying said predetermined internal voltage to corresponding memory arrays when conductive; and
(h) a switching element provided for said spare memory array for supplying said predetermined internal voltage when conductive, wherein said voltage supply control means controls conduction and non-conduction of said switching element.

* * * * *